United States Patent [19]

Balyoz et al.

[11] 4,249,193
[45] Feb. 3, 1981

[54] LSI SEMICONDUCTOR DEVICE AND FABRICATION THEREOF

[75] Inventors: John Balyoz, Hopewell Junction; Chi S. Chang, Wappingers Falls; Barry C. Fox, Poughkeepsie; John A. Palmieri, Wappingers Falls; Majid Ghafghaichi, Poughkeepsie; Teh-Sen Jen, Fishkill; Donald B. Mooney, Poughkeepsie, all of N.Y.

[73] Assignee: International Business Machines Corporation, Armonk, N.Y.

[21] Appl. No.: 909,605

[22] Filed: May 25, 1978

[51] Int. Cl.³ .................................. H01L 27/02
[52] U.S. Cl. ..................... 357/40; 357/15; 357/34; 357/35; 357/44; 357/45; 357/46; 357/50; 357/51; 357/68; 357/71; 357/92
[58] Field of Search ............... 357/15, 34, 35, 40, 357/44, 45, 46, 50, 51, 68, 71, 92

[56] References Cited

U.S. PATENT DOCUMENTS 3,312,871  4/1967  Seki et al. .................. 357/40

Primary Examiner—Edward J. Wojciechowicz
Attorney, Agent, or Firm—Wesley DeBruin

[57] ABSTRACT

Disclosed is an improved masterslice design technique including structure, wiring, and method of fabricating, to provide improved Large Scale Integrated Devices.

In accordance with the improved masterslice technique a plurality of semiconductor chips are provided wherein essentially the entire semiconductor surface area of each chip is utilized to provide cells selectable to be personalized (wired). None of the semiconductor surface area is dedicated for wiring channels. The individual cell area and cell configuration is optimally arrived at to facilitate wiring the maximum number, if not all of the cells contained on each chip, whereby circuit density is materially improved and a wide variety LSI device part numbers may be readily fabricated.

27 Claims, 51 Drawing Figures

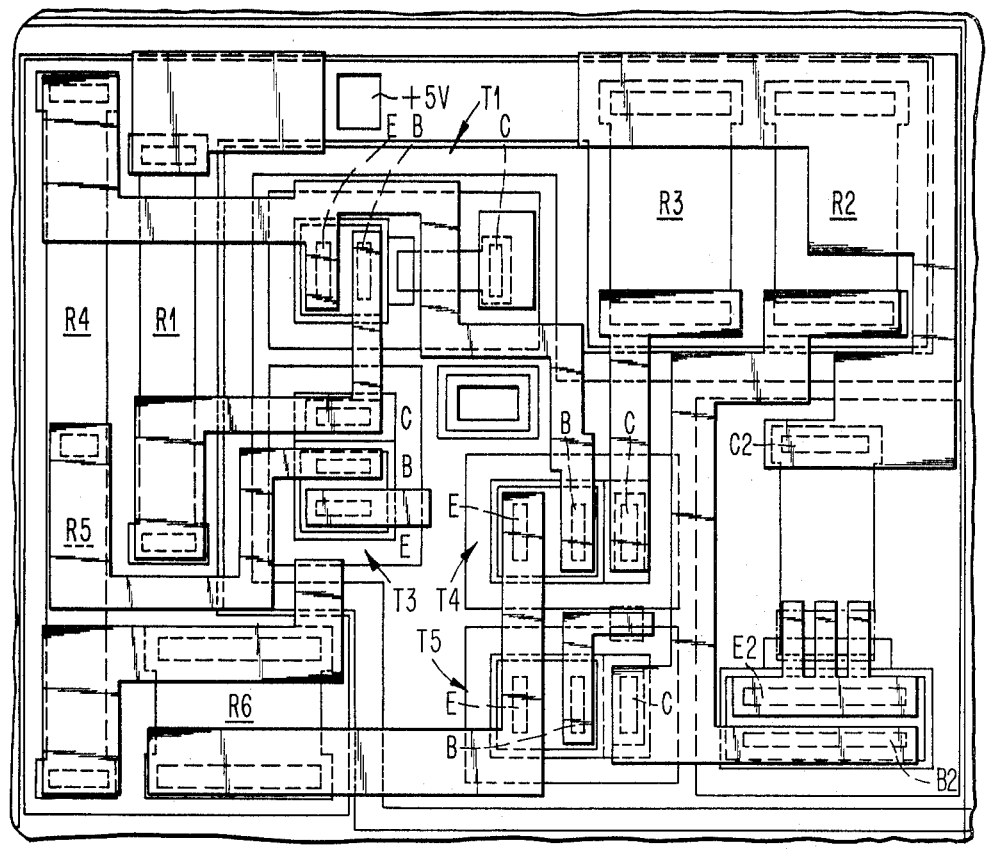
FIG. 4  STL VOLTAGE REGULATOR
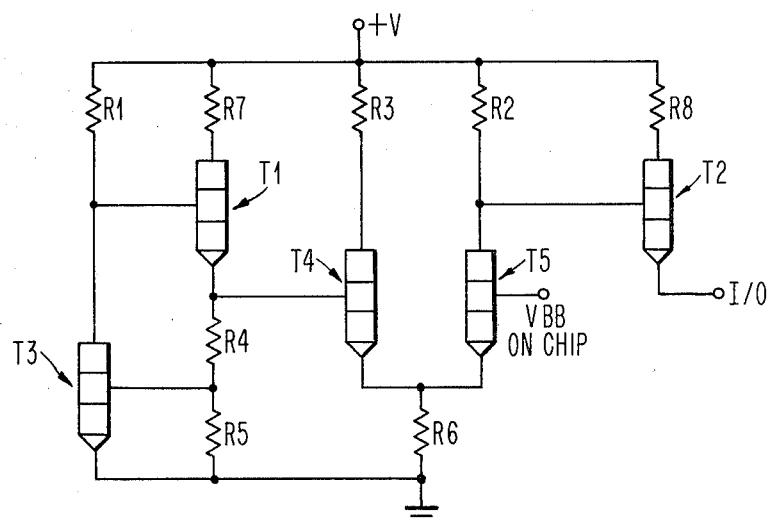
FIG. 4A  STL VOLTAGE REGULATOR

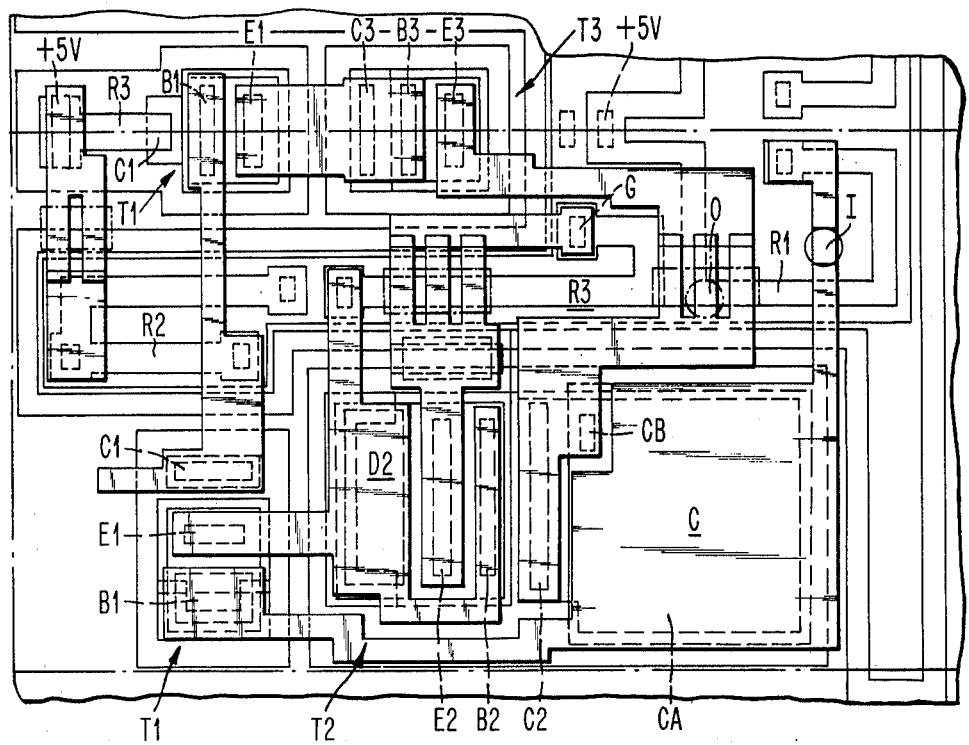
FIG. 5 STL PUSH-PULL DRIVER
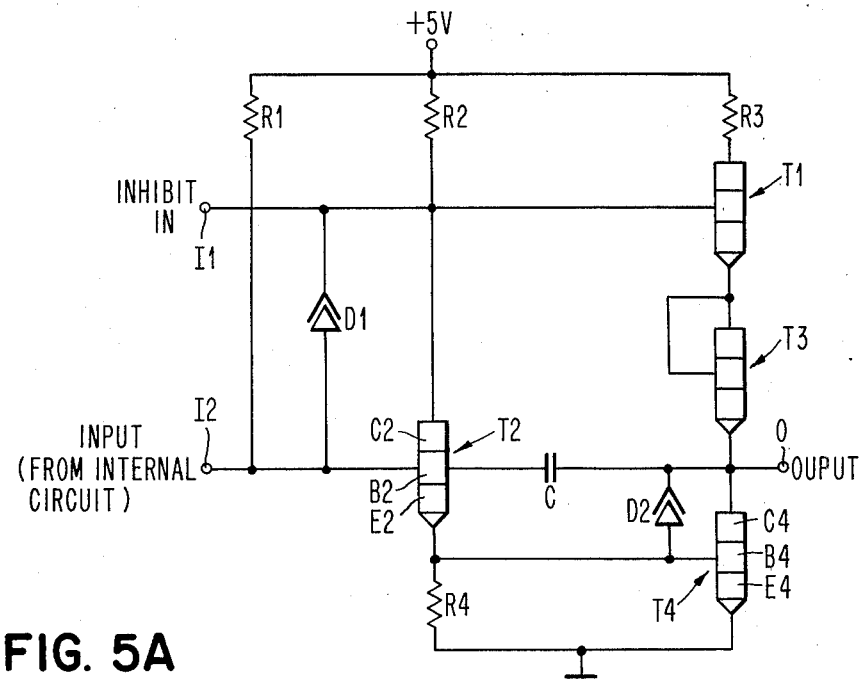
FIG. 5A
STL PUSH-PULL DRIVER

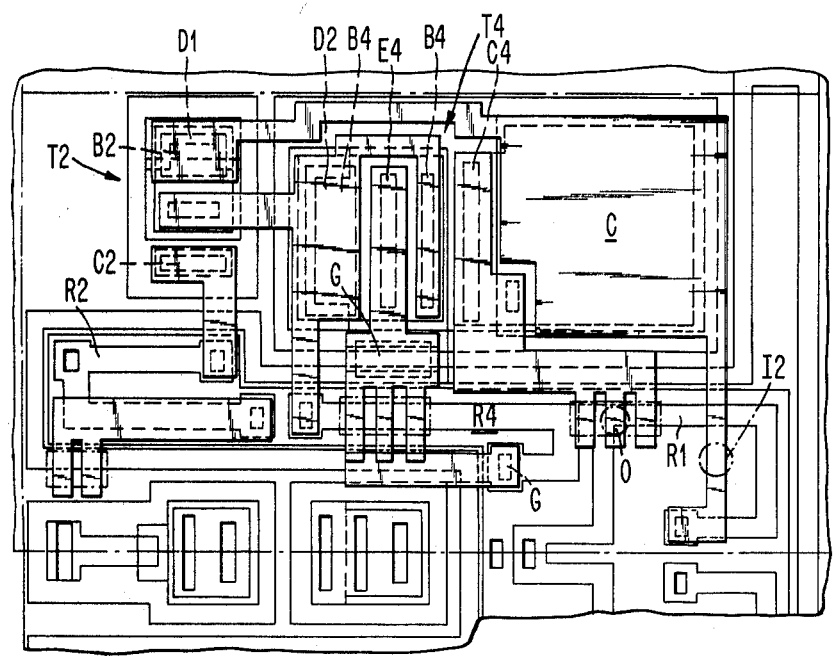
FIG. 6 SLT OPEN COLLECTOR DRIVER
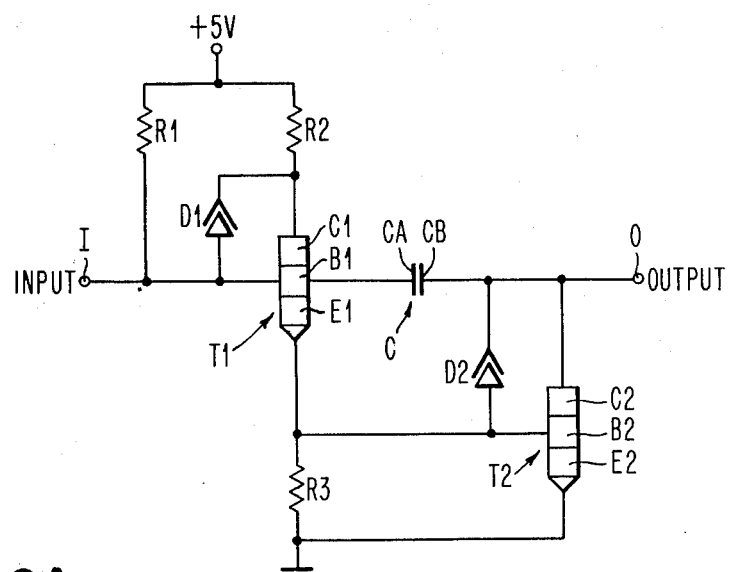
FIG. 6A SLT OPEN COLLECTOR DRIVER

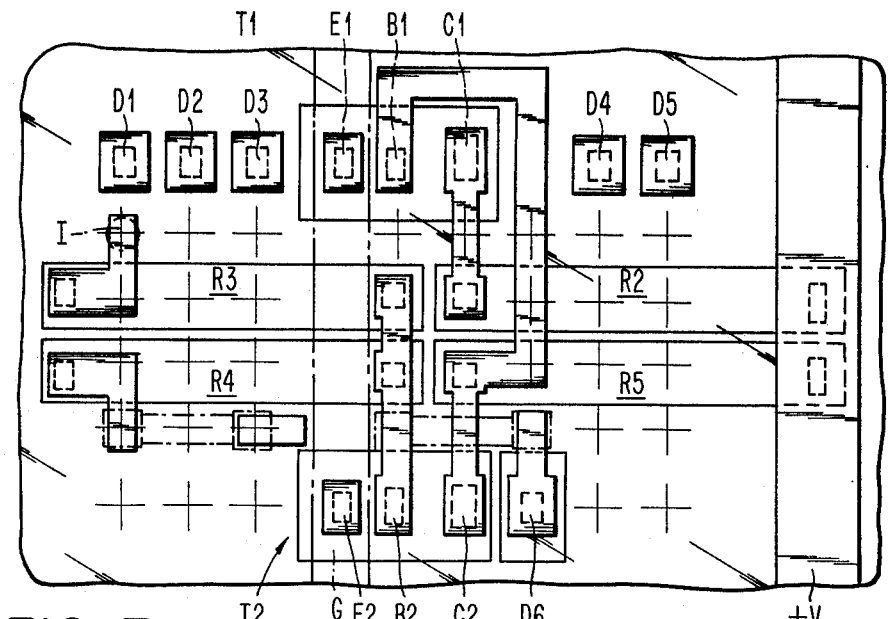
FIG. 7 SLT INPHASE RECEIVER
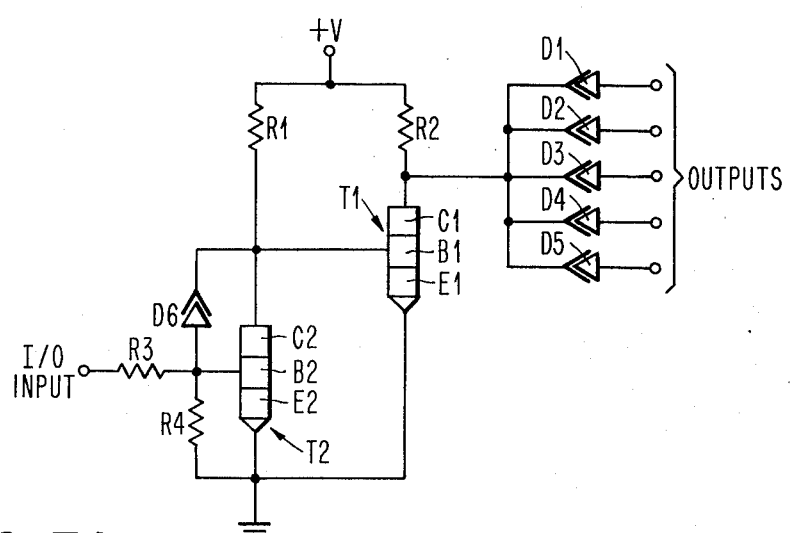
FIG. 7A SLT INPHASE RECEIVER

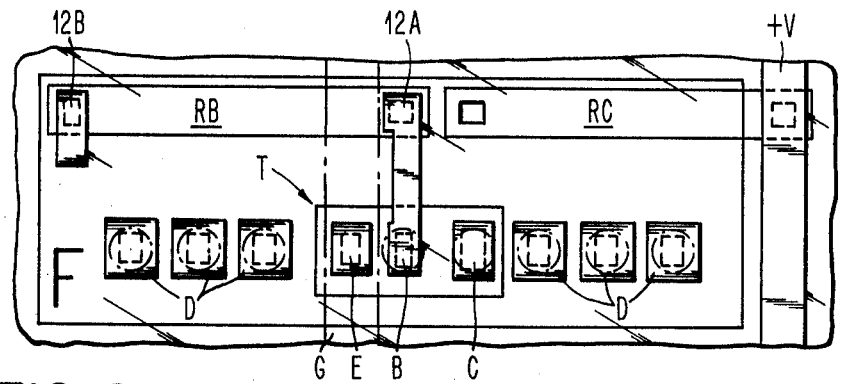
FIG. 8 AI WITH NO RC
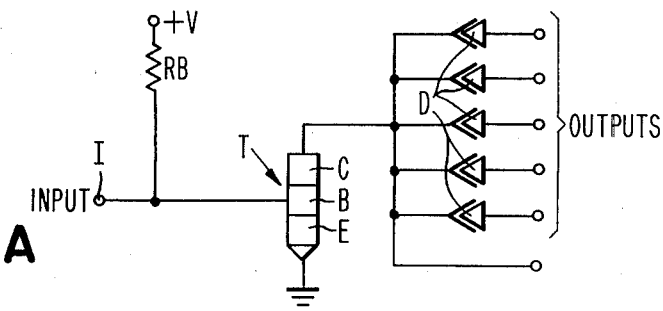
FIG. 8A
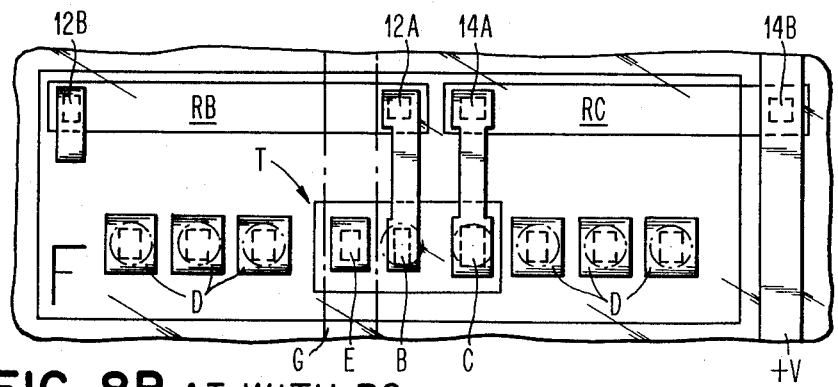
FIG. 8B AI WITH RC
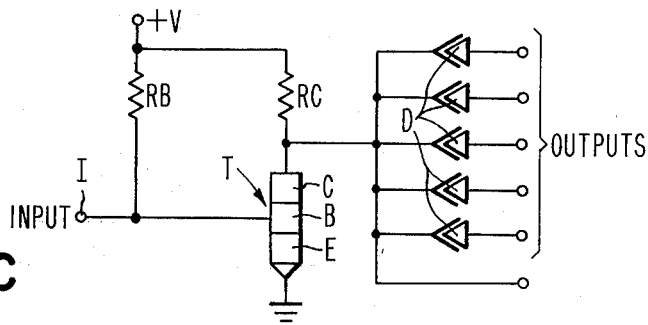
FIG. 8C

FIG. 10

| FIG. 11CL | FIG. 11CR |

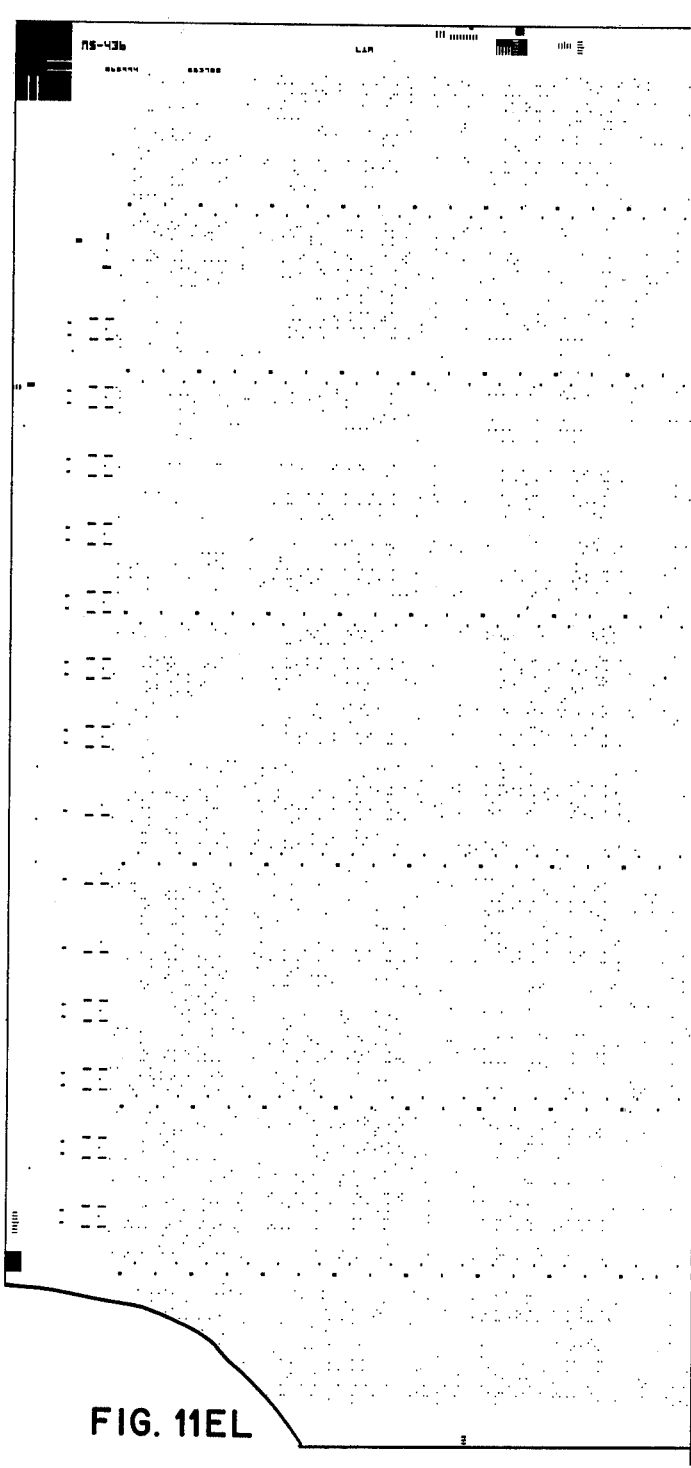
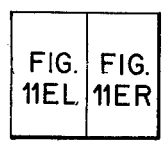
FIG. 11E     FIG. 11EL

LSI SEMICONDUCTOR DEVICE AND FABRICATION THEREOF

DESCRIPTION

Technical Field

This invention relates to improved masterslice design techniques, including method of fabricating and structure, to provide improved large scale integrated devices.

A primary object of the invention is to provide an improved large scale integrated semiconductor device.

A primary object of the invention is to provide an improved method of fabricating large scale integrated semiconductor devices.

A primary object of the invention is to provide an improved method of fabricating large scale integrated semiconductor devices in accordance with a masterslice design technique.

A further primary object of the invention is to provide an improved large scale integrated semiconductor device fabricated in accordance with masterslice design techniques.

A further object of the invention is to provide improved wiring density on large scale integrated semiconductor chips fabricated in accordance with novel masterslice design techniques.

A further object of the invention is to provide improved cell density on semiconductor chips to thereby increase the circuit density of the large scale integrated semiconductor devices fabricated in accordance with masterslice design techniques.

Another object of the invention is to provide an improved large scale integrated semiconductor device in accordance with masterslice design techniques wherein increased cell density and wiring density are employed to increase the number of cells available for utilization in the semiconductor device.

Another object of the invention is to provide an accordance with masterslice design techniques a plurality of semiconductor chips wherein essentially the entire semiconductor surface area of each chip is utilized to provide cells.

Another object of the invention is to provide in accordance with masterslice design techniques a plurality of semiconductor chips wherein essentially the entire semiconductor surface area of each chip is utilized to provide cells and minimally spaced wiring on a substantially fixed grid is employed to interconnect said cells, whereby a maximum number, if not all, of said cells are available for wiring to provide the circuit configuration of a large scale integrated semiconductor device on each of said semiconductor chips.

CROSS-REFERENCE TO CO-PENDING APPLICATIONS

U.S. patent application Ser. No. 830,715, entitled Integrated Circuit Layout Utilizing Separated Active Circuit and Wiring Regions, filed Sept. 6, 1977 by J. Balyoz et al and of common assignee herewith.

U.S. patent application Ser. No. 827,912, entitled Tantalum Semiconductor Contacts and Method for Fabricating Same, filed Aug. 26, 1977 by H. M. Dalal et al and of common assignee herewith.

BACKGROUND OF THE INVENTION AND DESCRIPTION OF THE PRIOR ART

The present invention relates to semiconductor integrated circuits, and more particularly, to Large Scale Integrated (LSI) circuits comprising a plurality of mutually connected unit cells on a single semiconductor chip. The invention also includes an improved method for fabricating the improved semiconductor devices.

A semiconductor integrated circuit consists of functional circuits integrally formed on a single semiconductor substrate, so that circuit means using integrated circuits are characterized by their miniaturized dimensions and a remarkably high reliability in operation. Accordingly, the semiconductor integrated circuits are extremely valuable in numerous applications and fields. For example, in data processing systems wherein the object is to process data, or information, with accuracy as well as at a high speed. Thus, most of the circuits and specifically logic circuits or the like, in use are in the form of integrated circuits. In the art of semiconductor devices, dedicated and intense efforts have been made, and continue to be made, to increase the density of integration of circuit components formed on a single semiconductor substrate, or chip. With the progress of integrated circuit manufacturing techniques these efforts have resulted in a far more extensive function being performed by a single integrated circuit chip. Herein the term "cell" or "unit cell" is used to designate a fundamental functional circuit (semiconductor structure) which is employed to construct a more extensive circuit, subsystem or system. For example, the unit cell may be an AND circuit, a NAND circuit, an OR circuit, Flip-Flop circuit or the like. The term "LSI circuit" is used to designate a circuit including a plurality (sizeable number) of interconnected unit cells formed on a single semiconductor substrate, or chip. The term "LSI circuit" is also used to designate a much greater number of integrated circuit components as compared with a unit cell.

Conceptionally, the LSI circuit may be considered a development or extension of the conventional integrated circuit. However, practically, since in the LSI circuit a very sizeable number of circuit components must be contained on one substrate, a number of complications, in particular, cell size, cell content, cell configuration, wiring (interconnections) etc., must be carefully and fully addressed. These complications and problems, and in particular, wiring (interconnections) are not nearly so serious or acute, and are more readily solved at this time in the fabrication of conventional integrated circuits. In the fabrication of conventional integrated circuits the custom design approach, or techniques, have been very effective. (Where the custom design approach, or technique, as is well known in the art, may be defined as the maximum utility of the area of the semiconductor substrate, or chip, for only a portion of the circuits implemented on a particular substrate, or chip, by individually designing the component location and metallization connection for each required circuit). The custom design approach has been and is effective in the fabrication of conventional integrated circuits. The custom design approach usually results in an overall less dense substrate, or chip, due to less dense wiring between densely designed groups of circuits. Also the custom design approach requires a very sizeable amount of time and effort to design a particular system or subsystem. The custom approach is not practical in the fabrication of many large scale integrated (LSI) semiconductor devices where the circuit density is very high, the system circuit is complicated, and extensive, dense, complicated wiring is required. One of the strongest reasons the custom design approach is not particularly suited or efficient for LSI semiconductor devices is that the custom design approach necessitates designing, for each individual LSI circuit (or part number) both impurity diffusion masks for forming the circuit elements and interconnection masks for interconnecting the circuit elements.

In order to obviate the deficiencies in the custom design approach a number of approaches have been proposed and utilized in the art. One such approach is the masterslice design approach. In the master-slice design approach, a great number of circuit elements or unit cells are formed and arranged on a substrate beforehand so as to be able to obtain by modifying the interconnection metallization patterns a number of different LSI circuits (LSI semiconductor devices or part numbers). It will be apparent, as known in the art, that any one of a number of desired LSI circuits may be fabricated by properly interconnecting the already formed and arranged circuit elements, or cells. The masterslice design approach is advantageous in that the same diffusion mask (or masks) can be used to produce a plurality of different LSI circuits (LSI semiconductor devices or part numbers) merely by designing appropriate masks for effecting metallization for each part number or different LSI circuit. Providing interconnection metallization is the final fabrication step or steps in the process of producing LSI semiconductor devices. As stated earlier herein, the custom design approach and masterslice design approach for providing LSI semiconductor devices are respectively well known to persons skilled in the art.

With reference to U.S. Patent numbers, additional prior art disclosures and teachings in the field of integrated circuits are identified.

Reference is made to U.S. Pat. No. 3,312,871, entitled "Interconnection Arrangement for Integrated Circuits" granted Apr. 4, 1967 to H. Seki et al., and of common assignee herewith.

Reference is made to U.S. Pat. No. 3,377,513, entitled "Integrated Circuit Diode Matrix" granted Apr. 9, 1968 to R. M. Ashby et al.

Reference is made to U.S. Pat. No. 3,423,822 entitled "Method of Making Large Scale Integrated Circuit" granted Jan. 28, 1969 to I. A. Davidson et al.

Reference is made to U.S. Pat. No. 3,475,621 entitled "Standarized High Density Integrated Circuit Arrangement and Method" granted Oct. 28, 1969 to A. Weinberger and of common assignee herewith.

Reference is made to U.S. Pat. No. 3,484,932 entitled "Method of Making Integrated Circuits" (original filing date Aug. 31, 1962) granted Dec. 23, 1969 to C. R. Cook, Jr.

Reference is made to U.S. Pat. No. 3,553,830 entitled "Method For Making Integrated Circuit Apparatus" granted Jan. 12, 1971 to F. J. Jenny et al. and of common assignee herewith.

Reference is made to U.S. Pat. No. 3,558,992 entitled "Integrated Circuit Having Bonding Pads Over Unused Active Area Components" granted Jan. 26, 1971.

Reference is made to U.S. Pat. No. 3,581,385 entitled "Method For Fabricating Large Scale Integrated Circuits with Discretionary Wiring" granted June 1, 1971 to J. W. Lathrop.

Reference is made to U.S. Pat. No. 3,598,604 entitled "Process of Producing An Array of Integrated Circuits on Semiconductor Substrate" granted Aug. 10, 1971 to A. H. DePuy and of common assignee herewith.

Reference is made to U.S. Pat. No. 3,615,463 entitled "Process of Producing An Array of Integrated Circuits on Semiconductor Substrate" granted Oct. 26, 1971 to W. N. Kuscheel and of common assignee herewith.

Reference is made to U.S. Pat. No. 3,618,201 entitled "Method of Fabricating LSI Circuits" granted Nov. 9, 1971 to T. Makimoto et al.

Reference is made to U.S. Pat. No. 3,689,803 entitled "Integrated Circuit Structure Having A Unique Surface Metallization Layout" granted Sept. 5, 1972 to T. H. Baker et al and of common assignee herewith.

Reference is made to U.S. Pat. No. 3,702,025 entitled "Discretionary Interconnection Process" granted Nov. 7, 1972 to A. I. Archer.

Reference is made to U.S. Pat. No. 3,707,036 entitled "Method for Fabricating Semiconductor LSI Circuit Devices" granted Dec. 26, 1972 to T. Okabe et al.

Reference is made to U.S. Pat. No. 3,762,037, entitled "Method of Testing for the Operability of Integrated Semiconductor Circuits having A Plurality of Separable Circuits" granted Oct. 2, 1973 to T. H. Baker et al.

Reference is made to U.S. Pat. No. 3,771,217 entitled "Integrated Circuit Arrays Utilizing Discretionary Wiring and Method of Fabricating Same" granted Nov. 13, 1973 to T. E. Hartman.

Reference is made to U.S. Pat. No. 3,795,972 entitled "Integrated Circuit Interconnections by Pad Relocation" granted Mar. 12, 1974 to D. F. Calhoun.

Reference is made to U.S. Pat. No. 3,795,973 entitled "Multi-Level Large Scale Integrated Circuit Array Having Standard Test Points" granted Mar. 12, 1974 to D. F. Calhoun.

Reference is made to U.S. Pat. No. 3,795,974 entitled "Repairable Multi-Level Large Scale Integrated Circuit" granted Mar. 12, 1974 to D. F. Calhoun.

Reference is made to U.S. Pat. No. 3,795,975, entitled "Multi-Level Large Scale Complex integrated Circuit Having Functional Interconnected Circuit Routed to Master Patterns" granted Mar. 12, 1974 to D. F. Calhoun.

Reference is made to U.S. Pat. No. 3,981,070 entitled "LSI Chip Construction and Method" granted Sept. 21, 1976 to F. K. Buelow et al.

Reference is made to U.S. Pat. No. 3,983,619 entitled "Large Scale Integrated Circuit Array of Unit Cells and Method of Manufacturing Same" granted Oct. 5, 1976 to M. Kubo et al.

Reference is made to U.S. Pat. No. 3,984,860 entitled "Multi-Function LSI Wafers" granted Oct. 5, 1976 to J. C. Logue and of common assignee herewith.

Reference is made to U.S. Pat. No. 3,993,934 entitled "Integrated Circuit Structure Having a Plurality of Separable Circuits" granted Nov. 23, 1976 to T. H. Baker et al. and of common assignee herewith.

Reference is made to U.S. Pat. No. 3,999,214 entitled "Wireable Planar Integrated Circuit Chip Structure" granted Dec. 21, 1976 to E. E. Cass and of common assignee herewith.

Reference is made to U.S. Pat. No. 4,006,492 entitled "High Density Semiconductor Chip Organization" granted Feb. 1, 1977 to E. B. Eichelberger et al and of common assignee herewith.

Reference is made to U. S. Pat. No. 4,032,962 entitled "High Density Semiconductor integrated Circuit Layout" granted June 28, 1977 to J. Balyoz et al and of common assignee herewith.

Reference is made to U.S. Pat. No. 3,539,876 entitled "Monolithic Integrated Structure Including Fabrication Thereof" granted Nov. 10, 1970 to I. Feinberg et al and of common assignee herewith.

Reference is made to U.S. Pat. No. 3,633,268, entitled "Method of Producing One or More Large Integrated Semiconductor Circuits", granted Jan. 11, 1972 to R. Engbert.

As is apparent from the prior art, there are numerous semiconductor device fabrication techniques, and approaches known to the art for the fabrication of semiconductor devices. At least certain of these techniques have been or are employed in the art. Known approaches may for convenience be generally classified as "custom", and "masterslice". The interconnection metallurgy techniques, as known to the art, may be generally classified as "fixed", "discretionary" and "hybrid". Where "hybrid" is a wiring technique which at least in part combines the features of the "fixed" and "discretionary" techniques. Numerous wiring techniques, as generally classified supra have been employed in the art.

SUMMARY OF THE INVENTION

The invention disclosed in detail hereinafter is directed to an improved method of fabricating LSI semiconductor devices utilizing an improved masterslice technique and an improved LSI chip wiring technique. The practice of the method in accordance with the invention provides improved LSI semiconductor devices.

In accordance with the invention essentially the entire semiconductor surface area, with the exception of isolation regions between cells and a limited width border area at the perimeter of the chip is utilized to provide unit cells. The unit cells on the chip surface are closely spaced one to another. The space between the unit cells, having a very small surface width, is utilized to provide electrical isolation. Also, a narrow perimeter portion of the chip is not utilized. (This is the kerf portion of the chip prior to dicing and may have physical irregularities). The unit cells contained on the chip may vary in size (area), configuration, component content, and intended function.

However, in the illustrative embodiment of the invention, except for a limited number of the unit cells, all cells are of uniform configuration, component content, and equal in chip surface area occupied. As will be more apparent from the detailed description hereinafter all of the cells are arranged in an array (columns and rows). Further, the majority of the cells are arranged in clusters of four wherein each cell has a unique geometric orientation with respect to the remaining three cells of its cluster. Each of the cells has been designed to utilize a minimum of semiconductor area consistent with the following factors: (1) a configuration of cell area which facilitates wiring by disposing and arranging the active areas of the cell to enhance wiring density; (2) a configuration of the cell area which facilitates efficient utilization of said cell in a column-row array including cells differing in required silicon area (all cells included in an array on a semiconductor chip surface); (3) a configuration of cell area and size of each cell type which is consistent with the configuration of cell area and size of each other cell type contained within the array on the semiconductor chip to thereby enhance wiring density on the chip; and (4) cell area and configuration in conjunction with densely spaced first and second levels of wiring to permit utilization in an integrated circuit of a maximum number of said cells, if not all, to thereby further enhance the extent of the function (system, logic, etc.) performed by the integrated circuit contained on a single semiconductor chip.

Further, in accordance with the invention at least first and second densely spaced wiring levels are utilized to provide an improved semiconductor device in the form of large scale integrated circuit having the following advantages and features: (1) increased circuit density with corresponding enhancement in scope of the system, logic, or memory function performed by a single integrated circuit chip; and (2) an integrated circuit chip containing a very large number of wireable cells whereby utilizing masterslice techniques by which a very sizeable number of different "part numbers" may readily be fabricated.

As will be more fully appreciated from the more detailed description of an illustrative embodiment of the invention set forth hereinafter the invention encompasses an improved semiconductor device by utilizing known semiconductor process technology in conjunction with minimum cell area in a cell configuration complementing a dense wiring scheme. Namely, in accordance with the invention the cell configuration and dense wiring are preconceived to be utilized jointly to provide an improved semiconductor device.

The foregoing and other objects features and advantages of the invention will be apparent from the following more particular description and preferred embodiments of the invention as illustrated in the accompanying drawings.

BRIEF DESCRIPTION OF THE DRAWINGS

FIG. 3 further depicts the geometric orientation, or arrangement, of each cell in each cluster of two like cells.

FIG. 4 shows an enlarged planar view, at least partially personalized, of a "Schottky Diode Transistor Logic (STL) On Chip Voltage Regulator Cell" shown in the chip layout of FIG. 1 as cell VR.

FIG. 4A depicts the schematic circuit diagram, "STL On Chip Voltage Regulator", provided by the cell of FIG. 4 when fully personalized.

FIG. 5 shows an enlarged planar view, at least partially personalized, of an "STL Push-Pull Driver Cell" shown in the chip layout of FIG. 1.

FIG. 5A depicts the schematic circuit diagram, "STL Push-Pull Driver" provided by the cell of FIG. 5 when fully personalized.

FIG. 6 shows an enlarged planar view, at least partially personalized, of an "STL Open Collector Driver Cell" shown in the chip layout of FIG. 1.

FIG. 6A depicts the schematic circuit diagram, "STL Open Collector Driver" provided by the cell of FIG. 6 when fully personalized.

FIG. 7 shows an enlarged planar view, at least partially personalized, of an "STL In-Phase Receiver Cell" shown in the chip layout of FIG. 1. This cell is identical to two of the cluster of four-like cells of the first type shown in FIG. 1, except for the intracell personalization.

FIG. 7A depicts the schematic circuit diagram "STL In-Phase Receiver Cell" provided by the cell of FIG. 7 when fully personalized.

FIG. 8 shows an enlarged planar view, at least partially personalized, of an "AND-Inverter Circuit (STL Internal circuit) Cell" shown in the chip layout of FIG. 1.

FIG. 8A depicts the schematic circuit diagram "AND-Inverter Circuit" (STL Internal Circuit) provided by the cell of FIG. 8 when fully personalized. [It will be noted that resistor RC is not utilized].

FIG. 8B shows an enlarged planar view, at least partially personalized, of an "AND-Inverter Circuit (STL Internal Circuit) Cell" shown in the chip layout of FIG. 1.

FIG. 8C depicts the schematic circuit diagram AND-Inverter circuit (STL Internal Circuit) provided by the cell of 8B, when fully personalized. [It will be noted that resistor RC is utilized].

FIG. 10 shows a representative and enlarged planar view of the outermost (exposed) metal layer (footprint) of the completely fabricated semiconductor chip (part number device). The "footprint" is an array of solderable pads or contacts, preferably lead/tin (or the equivalent), utilizing intervening wiring levels contained on the chip to provide an electrical connection between the large scale integrated circuit contained on the silicon surface of the chip and circuitry external to the chip.

DESCRIPTION OF THE PREFERRED EMBODIMENTS OF THE INVENTION

The specific embodiments of the invention will now be described. Since the invention resides primarily in the structural layout of a large-scale integrated (LSI) circuit in combination with the wiring thereof (personalized metallization layout) rather than in any specific semiconductor process for forming integrated circuits or insulated metallization patterns, the processes for forming integrated circuits and the various metallization levels will not be described in extensive detail. However, personalized contacts to the silicon is part of the semiconductor process and essential for achieving high density wiring in accordance with the invention. Therefore, the basic steps of the semiconductor process will be described. Unless otherwise stated, it may be assumed that any of the conventional known photolithographic processes utilizing either diffusion or ion implantation may be used in the formation of the devices in the integrated circuit and that any of the conventional, or standard, known processes for forming insulated layers of wiring (metallization), specifically including multi-layer wiring may be utilized to provide the required wiring. For example, the improved large scale integrated circuit device, in accordance with the invention, may be fabricated utilizing the processes described in either U.S. Pat. Nos. 3,539,876 or 3,656,028 among others. Correspondingly, reference is made to U.S. Pat. Nos. 3,558,992, 3,725,743 and 3,539,876, among others, for processes which may be employed to provide the various metallization levels (wiring levels), the insulative layers separating the metallization levels and the via holes or openings in the insulative layers through which the various levels of metallization are interconnected.

Figure 1:
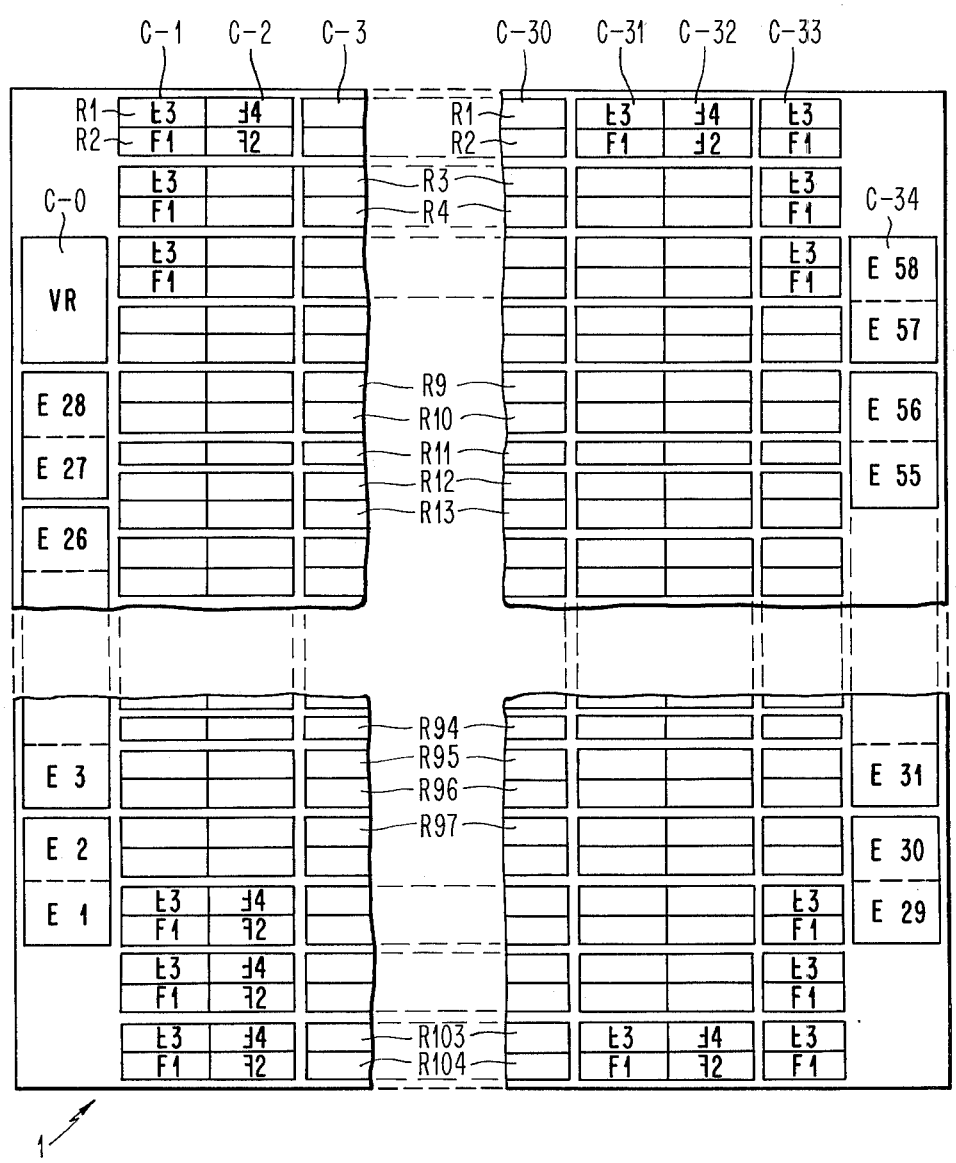
FIG. 1 shows an enlarged planar view of a semiconductor chip having cell configuration, cell layout and cell arrangement in accordance with the invention.

Referring to FIG. 1, a diagrammatic planar view is shown of the layout of the circuit cells (unit cells) in the surface of a large scale integrated (LSI) chip 1. The cells are arranged in thirty-five adjacently spaced columns respectively designated C-0 through C-34, in the Y orthogonal direction. Column C-0 includes twenty-nine cells respectively designated E1 through E28 and VR. Column C-34 includes thirty cells respectively designated E29 through E58. As will be more apparent from the detailed description hereinafter cells E1 through E58 of columns C-0 and C-34 may be more properly viewed as twenty-nine pairs of cells where each pair of cells is identical in potential usable component content (resistors, transistors, etc.) to every other pair of cells. Adjacently positioned cells E1 and E2 are a pair, as are cells E3, E4, etc., through E57 and E58. Columns C-1 through C-33 each contain one hundred and four cells. As will be noted from FIG. 1, the one hundred and four cells in each column are in rigorous row alignment with the one hundred and four cells in each of the remaining columns. As will be explained in greater detail hereinafter, with the exception of geometric orientation and rows 11, 24, 43, 62, 81 and 94, each of the cells in columns C-1 through C-33 is identical in semiconductor profile (i.e., active regions, potentially usable transistors, resistors and Schottky Barrier diodes). Alternately stated, the cells of columns C-1 through C-33 contain cells of a first type and cells of a second type. As will be explained in greater detail hereinafter, each of the first type of cells contained in rows 1 through 10, 12 through 23, 25 through 42, 44 through 61, 63 through 80, 82 through 93 and 95 through 104 of each of the columns C-1 through C-33 are identical one to another with the qualification that the cells of the first type are, with the exception of column C-33, arranged in clusters of four independent cells with each cell of each cluster being uniquely geometrically oriented with respect to the remaining three cells of its cluster. Rows 12, 24, 43, 62, 81 and 94 of each of the columns C-1 through C-33 contain cells of the second type. The cells of the second type are identical one to another in semiconductor profile, area, configuration and potentially usable components, with the qualification that the cells of the second type of columns C-1, C-3, C-5 and so on through C-33 have a geometric orientation differing with respect to the cells of the second type of columns C-2, C-4, C-6 and so on through C-32.

It will now be apparent that semiconductor chip 1, FIG. 1, which preferably is a silicon chip 0.185 inches by 0.185 inches contains a total of 3491 cells or unit cells. Namely, 58 cells E1 through E58, 1 cell VR, 3234 cells of said first type and 198 cells of said second type to provide a total of 3491 discrete unit cells. It is deemed appropriate to expressly point out that although throughout this specification a specific number of cells, type of cell, cell content, cell configuration, chip size, chip layout potentials etc., are expressly and concisely recited for completeness of explanation and to facilitate a complete and full understanding of applicants' invention by persons skilled in the art, applicants' invention is not to be construed as limited thereby. As will be readily apparent to persons skilled in the art, subsequent to a complete understanding of the invention, numerous modification may be made to applicants' illustrative embodiments without departing from the spirit and scope of applicants' invention.

Figure 2:
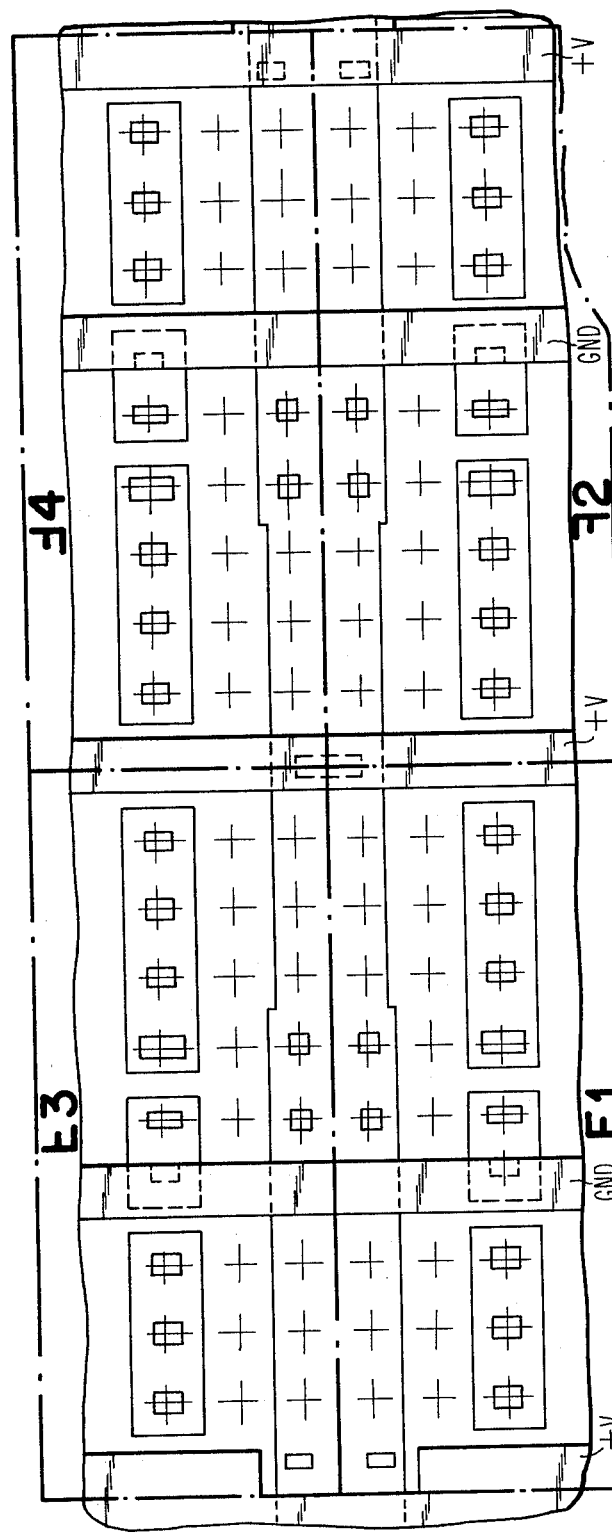
FIG. 2 shows an enlarged planar view of a single one of the plurality of clusters of four-like cells shown in the chip layout of FIG. 1. These cells are referred to hereinafter as cells of the first type.
Figure 2A:
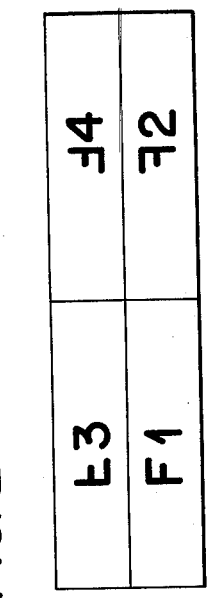
FIG. 2A, when viewed in conjunction with FIG. 2 depicts the geometric orientation, or arrangement, of each cell in each cluster of four-like cells.

FIG. 2 discloses an enlarged planar view of a cluster of four cells of said first type. FIG. 2A shows a rectangle subdivided into four equal rectangles. Each of the four rectangles represents a unit cell of the first type and contains the alphabetic letter F varied in orientation. The orientation of the letter F in the four rectangles of FIG. 2A and in FIG. 2 depict the orientation of cells of the first type one to another in the clusters of four. As seen from FIG. 1, this orientation of cells of the first type is consistently maintained in cell columns C-1 through C-32 of the cell layout of semiconductor chip 1. For example, the planar view of the cluster of four cells of the first type shown in FIGS. 2 and 2A correspond in orientation to the cells of the first type in columns C-1 and C-2, row 1 and 2 through columns C-31 and C-32, rows 103 and 104, giving due consideration to the fact that rows 11, 24, 43, etc., of columns C-1 through C-32, contain cells of said second type. As will now be apparent, column C-33 is identical in cell content and cell orientation to each of the odd numbered columns, namely C-1, C-3 - - - C-31.

Figure 3:
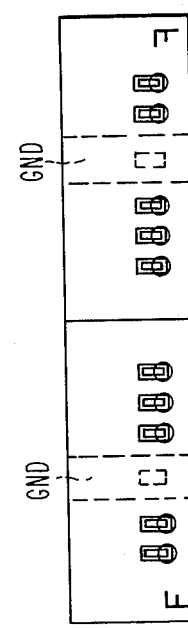
FIG. 3 shows an enlarged planar view of a single one of a plurality of like clusters of two like cells of the second type shown in FIG. 1.

FIG. 3 depicts a planar view of first and second cells of said second type. FIG. 3 shows a rectangle subdivided into two equal rectangles. Each of the two rectangles represents a unit cell of the second type and contains the alphabetic letter F varied in orientation. The orientation of the letter F in the two rectangles of FIG. 3 depicts the orientation of the cells of the second type one to another in clusters of two. The cells of the second type contained in a given row in columns C-1 and C-2, C-3 and C-4, C-5 and C-6 through C-31 and C-32 are oriented as shown in FIG. 3. As stated hereinabove, column C-33 is identical in cell content and cell orientation to each of the odd numbered columns, namely C-1, C-3 - - - C-31.

Referring to FIG. 1, it will now be apparent that the cell columns C-1, C-3, C-5 - - - C-33, with the exception as to their respective spacing from cell columns C-0 and C-34, are identical one to another. Also cell columns C-2, C-4, C-6 - - - C-32, with the exception as to their respective spacing from cell columns C-0 and C-34, are identical one to another. Further, each of the even numbered cell columns C-2, C-4, C-6, - - - C-32 is respectively the mirror image of each of the odd numbered cell columns C-1, C-3, C-5, - - - C-33.

Referring to the cell layout of semiconductor chip 1 depicted in FIG. 1 it is to be appreciated that essentially the entire surface of the chip is utilized to provide unit cells. The only portions of the chip surface not containing cells are small areas at each of the corners of the chip surface. As is well known in the art these areas are conventionally utilized for mask alignment in manufacturing, test circuits and patterns, chip identification, etc. Of even more significance it is to be appreciated no area of the chip surface has been dedicated to wiring or metallization.

Referring to FIGS. 1 and 2, each unit cell of the first type may be personalized to provide an integrated STL Internal Circuit (AND-INVERTER Logic circuit) having the schematic circuit of either FIG. 8A or FIG. 8C. The first level personalization (wiring) of a unit cell of the first type to provide the circuit of FIG. 8A is shown in FIG. 8. The first level personalization (wiring) of a unit cell of the first type to provide the circuit of FIG. 8C is shown in FIG. 8B. It is apparent that in the personalized cell of FIG. 8B the resistor RC is wired into the integrated circuit structure by suitably interconnecting the resistor RC by "book metal" (metallization) to the collector of the transistor and the potential source V. Whereas, in the personalized cell of FIG. 8 resistor RC is not interconnected by "book metal" to the collector of transistor and the potential source V. As used herein, the term "book metal" is intra-cell metallization, or wiring, which is essentially routinely called for by the program of a computer controlled design automation system. Further, as employed herein, the term personalized cell is a unit cell which includes book metal appropriately interconnecting components (transistor, resistors, etc.) of the cell. Herein, the term "book metal" is used only to designate first level intra-cell wiring.

Further, referring to FIG. 1, two cells of the first type may be personalized as depicted in FIG. 7, to provide an integrated circuit having the circuit schematic shown in FIG. 7A. The circuit of FIG. 7A is an STL In Phase Receiver. The only restriction on the selection of the two cells is that the cells must adjacently reside in the same column (C-1, C-3, C-5, - - - C-33) with one cell residing in a first numbered row and the other cell residing in the adjacent higher numbered row, where said cells have an orientation one to another as depicted in FIG. 7. For example, in each of the odd numbered columns (C-1, C-3, C-5, - - - C-33), the two cells selected to be personalized to provide an STL In Phase Receiver may be any one or more of the following cell pairs: a cell in row 1 and a cell in row 2 of any same odd numbered column, - - -, a cell in row 25 and a cell in row 26 of any same odd numbered column, - - - a cell in row 44 and a cell in row 45 of any same odd numbered column- ,—a cell in row 92 and a cell in row 93 of any same odd numbered column—, and a cell in row 103 and a cell in row 104 of any same odd numbered column. Thus, it is apparent a number of STL In Phase Receivers may be provided on the chip with almost complete flexibility as to the location (column and row) of each of the STL In Phase Receivers. [It is to be appreciated, the foregoing qualification as to "odd numbered" columns is not a limitation of the invention. It merely results from the particular configuration of the first level of metallization utilized in the preferred embodiment].

Referring to FIG. 1 any one or more of the cells E1 through E58 may be personalized (book metal) as depicted in FIG. 6 to each provide an integrated STL Open-Collector Driver. The circuit schematic of the STL Open-Collector Driver is shown in FIG. 6A. Thus, utilizing each of the cells, E1 through E58, it is possible to provide fifty-eight discrete integrated STL Open-Collector Drivers, FIGS. 6 and 6A.

Referring to FIG. 1 any one or more, with a maximum number of twenty-nine, of certain cells, cells E1 through E58 may be personalized, as depicted in FIG. 5 to each provide an integrated STL Push-Pull Driver. The circuit schematic of the STL Push-Pull Driver is shown in FIG. 5A. The "certain cells" of E1 through E58 which may be selected to be personalized to provide the STL Push-Pull Driver are either cell, but not both of each of the following cell pairs: E1, E2; E3, E4; E5, E6; - - -; and E57, E58. Further, when one cell of a cell pair (as recited supra) is selected to be personalized as an STL Push-Pull Driver, the remaining cell of said cell pair may be personalized only as an STL Open Collector Driver. Namely, each cell of each cell pair may be personalized as an STL Open-Collector Driver, however, only one cell of each cell pair may be personalized as an STL Push-Pull Driver. The foregoing qualification of the number and particular E type cells available to provide STL Push-Pull Drivers is not a limitation of the invention. It results from the fact that in this illustrative embodiment each pair of E type cells (E1, E2; E3, E4; - - -; and E57, E58) contains only a sufficient number of components to provide one "STL Push-Pull Driver" and one "STL Open-Collector Driver".

Referring to FIGS. 1 and 4, the cell VR may be personalized to provide an integrated "STL ON CHIP Voltage Regulator" the circuit schematic of which is depicted in FIG. 4A. It will be appreciated that although only a single cell VR is shown in the layout of FIG. 1, an additional one or more VR cells may be provided on chip 1.

Figure 2C:
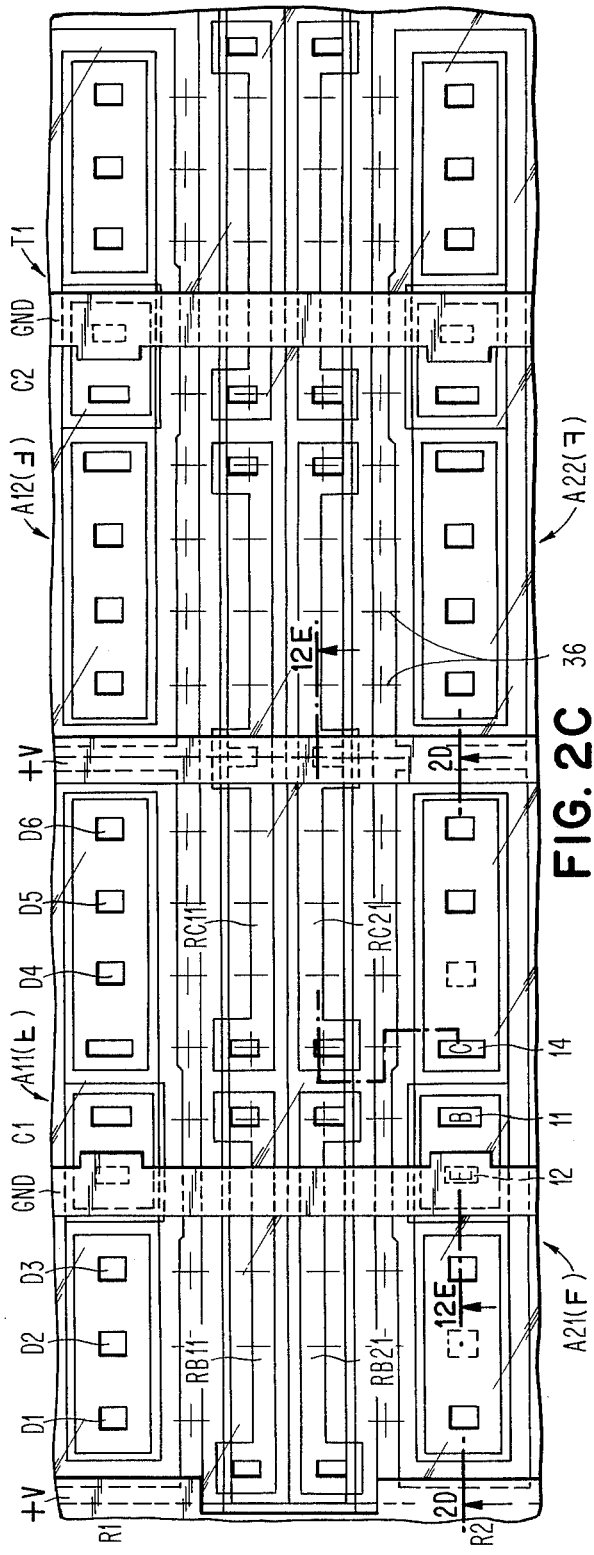
FIG. 2C, similar to FIG. 2, is a more detailed showing of the enlarged planar view of a single one of the plurality of clusters of four-like cells shown in the chip layout of FIG. 1.
Figure 2B:
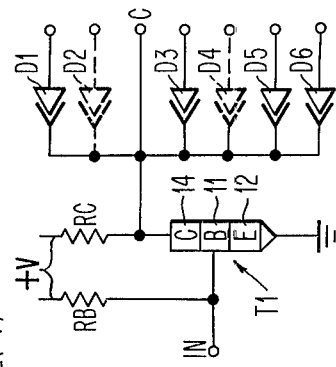
FIG. 2B is a Schottky transistor logic circuit. The schematic circuit diagram corresponds to the integrated circuit provided by any one of the four cells of FIG. 2 when personalized (intracell wiring).
Figure 2D:
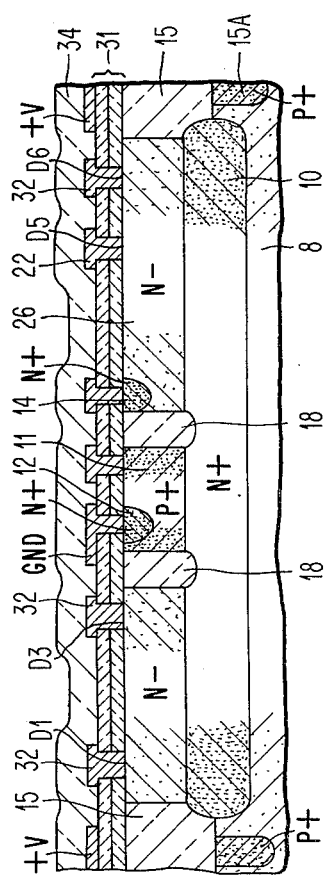
FIG. 2D is a cross-sectional view, taken along the line 2D—2D, of a representative cell of the cluster of four-like cells shown in FIG. 2C.

Reference is made to FIGS. 2B, 2C and 2D hereof, which substantially correspond to FIGS. 1, 2 and 2A of the drawing in pending U.S. patent application Ser. No. 830,715 entitled Integrated Circuit Layout Utilizing Separated Active Circuit and Wiring Regions, filed Sept. 6, 1977 by J. Balyoz et al., and of common assignee herewith. FIG. 2C shows a planar view of a cluster of four cells of said first type. The orientation of each cell of said cluster of four cells of FIG. 2C being identical to that explained earlier herein and as depicted in FIGS. 1, 2 and 2A. FIG. 2B is a circuit schematic of an integrated circuit which may be provided by any one of the four cells of FIG. 2C when suitable metal connections and interconnections are made thereto. FIG. 2D is a cross-sectional view of the structure of FIG. 2C taken along the line 2D—2D.

The circuit depicted in FIG. 2B is a Schottky-Transistor Logic Circuit for performing the NAND function. As is well known by persons skilled in the art, the logic operation is accomplished by steering the current from resistor RB. If all of the input signals to the base of transistor T1 are at a Down level, T1 is non-conductive and the output signals at the anodes of Schottky Barrier Diodes D1, D2, D3, D4, D5 and D6 are respectively at an UP level. If one, or more, of the input signals to the base of T1 is at an UP level T1 will be conductive and the anodes of the Schottky Barrier Diodes will be respectively at a Down level. Namely, when T1 is conductive each of the Schottky Barrier diodes is conductive. As is deemed to require no detailed discussion in view of the state of the art, by logically interconnecting a number of circuits of the type shown in FIG. 2B in a predetermined manner any one of a number of logical circuits may be provided.

FIG. 2C is a plan view of four cells A11, A12, A21 and A22 of said first type. The four cells, partially personalized, are respectively oriented as discussed earlier herein with reference to FIGS. 1, 2 and 2A. FIG. 2D is a cross-sectional view taken along the line 2D—2D. As stated earlier herein, with the exception of orientation, each cell of the first type is identical in size (area), configuration and potentially wireable component content. Thus, the following detailed description of only a single cell of the first type is deemed to be fully sufficient for providing a complete understanding of this feature of the illustrative embodiment of the invention. Each cell comprises a plurality of regions of different conductivity type (N or P) extending into the chip to provide transistors, diodes and resistors. These regions are interconnected at a first metallization level (wiring) by book metal superimposed on a first insulating layer 31. For example: the connection between resistor RB and the base 11 of transistor T1 is depicted by reference character 12A (FIG. 8); the connection between resistor RC and the collector 14 of transistor T1 is depicted by reference character 14A (FIG. 8B); the connection of the resistor RB to a +V potential bus is depicted by reference character 12B (FIG. 8); and the connection of the resistor RC to a +V potential bus is depicted by reference character 14B (FIG. 8B). The symbol + in FIG. 2C designates the location where a portion of second level wiring carried by a second insulating layer 34 is directly superimposed over a portion of first level wiring. It is to be noted that the first level wiring (Y direction in FIGS. 2, 2C) runs orthogonal to the second level wiring (X direction in FIGS. 2, 2C) and the wiring levels are separated and insulated one from the other by insulating layer 34.

Referring to FIG. 2D transistor T1 comprises an elongated subcollector 10 formed in substrate 8 with a collector region 14, a base region 11 and an emitter region 12 formed in epitaxial layer 26. Schottky barrier diodes D1, D2, D3, D4, D5 and D6 are respectively formable, three on each side of transistor T1 in epitaxial layer 26 and above subcollector 10. It is to be noted that diode D5 is relatively remotely spaced from collector 14. Isolation between circuits is provided by P+ region 15A and recessed oxide region 15 as is well known in the art. Isolation region 18 isolates reach-through region (collector) 14 from base 11 and emitter 12. It is to be noted that diodes D2 and D4 are shown in phantom in FIG. 2B since they are not personalized in FIG. 2D. Namely, as shown in FIG. 2D the necessary metallization (also termed book metal and personalization herein) has not been provided. It will be appreciated that a circuit of the type shown in FIG. 2B may be fabricated with or without a collector contact and zero through six Schottky barrier diode outputs. In the preferred embodiment, the circuit of FIG. 2B is provided with not more than any four of the six diodes. Elongated cell structures having a sizeable possible number of inputs are disclosed in the U.S. Pat. No. 4,032,962 to Balyoz et al., of common assignee herewith. The relatively wide busses, or conductors repetitively spaced and respectively labelled +V and GND extend in the Y direction (or columnar direction) to provide appropriate potentials to the cells utilized in providing the large scale integrated circuit. The conductors +V and GND, superimposed on insulating layer 31 and as seen from FIG. 2D, are first level wiring, or metallization, and extend at a right angle with respect to the length of the cells of the first type A11-A22. Resistors RB and RC of the circuit of FIG. 2B correspond with resistors RB21 and RC21 of cell A21, resistors RB22 and RC22 of cell A22, etc. It will be noted, the elongated configuration of the cells in addition to facilitating wiring facilitates the formation of elongated resistors RB and RC.

In accordance with the preferred embodiment of the invention, as fully explained herein, the improved large scale integrated circuit device utilizes four levels of metallization. In FIGS. 2, 2C and 2D, for purposes of clarity, only a portion of the first level of metallization is specifically illustrated and none of the second, third and fourth levels are shown or illustrated. As stated earlier herein, only selected ones of the Schottky barrier diodes of each cell to be wired are fabricated by appropriate metallization and interconnected by first level metallization 32. The cells to be utilized, or wired, are appropriately personalized (book metal) and first and second levels of metallization (wiring) are utilized to interconnect the required cells to provide the large scale integrated circuit. The potential crossovers, or intersections of the first and second levels, separated by insulating layer 34 (FIG. 2D) are depicted by reference character 36 in FIG. 2C. The third level wiring, as further discussed hereinafter, is preferably a relatively fixed wiring pattern, or layer of metallization interconnecting the second level with the fourth level (device contact interface as further discussed hereinafter). Thus, each of the cells of the chip layout of FIG. 1 has superimposed thereover, in accordance with the illustrative embodiment of the invention four levels of wiring. It will be appreciated that the practice of applicants' invention is not necessarily limited to, or to be construed as limited to structures utilizing four levels of metallization.

Figure 2E:
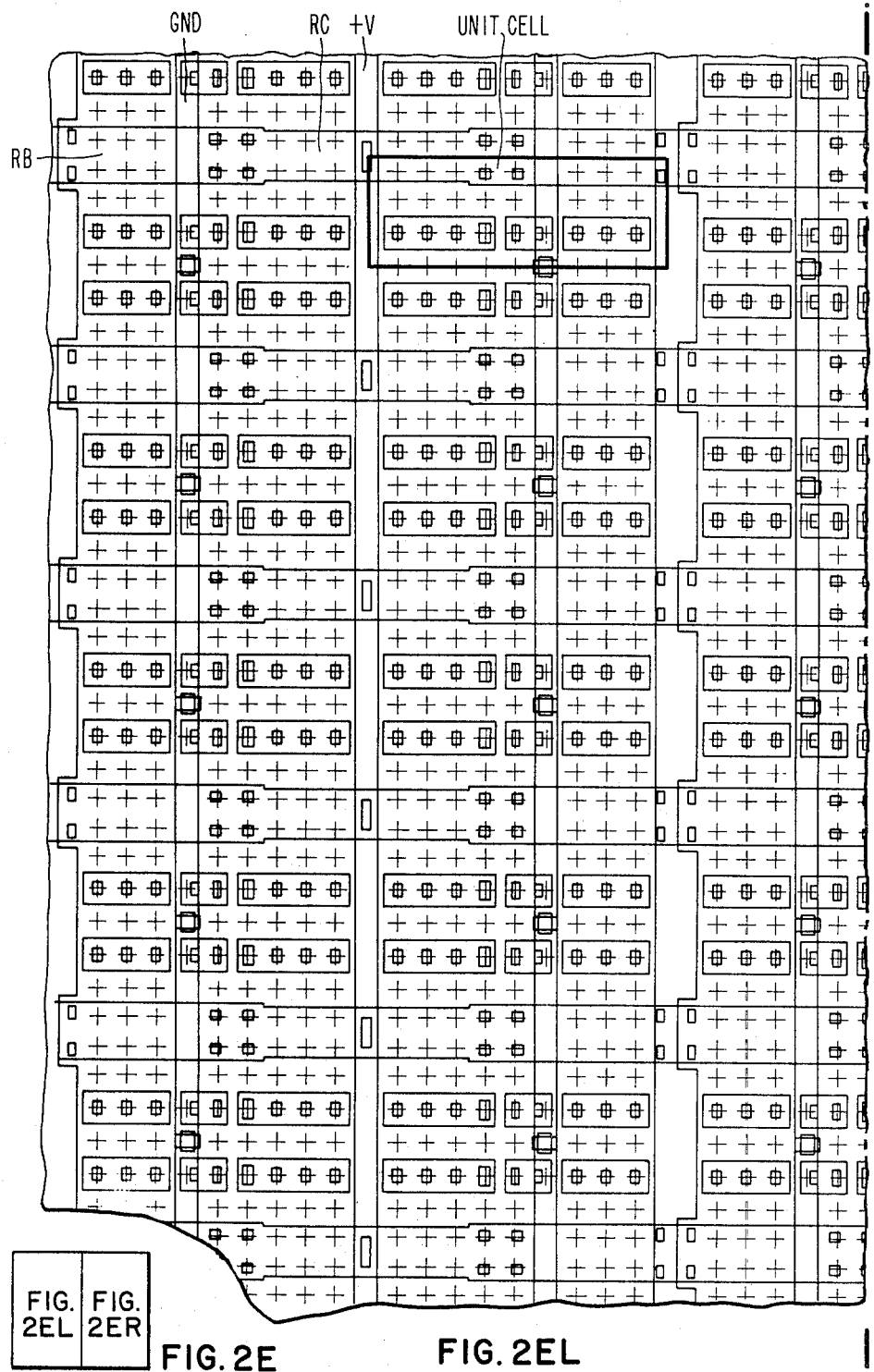
FIG. 2E, a composite of FIG. 2EL and FIG. 2ER, is an enlarged more detailed planar view of a portion of FIG. 1 showing a relatively sizeable number of cells of the first type.
Figure 2E:
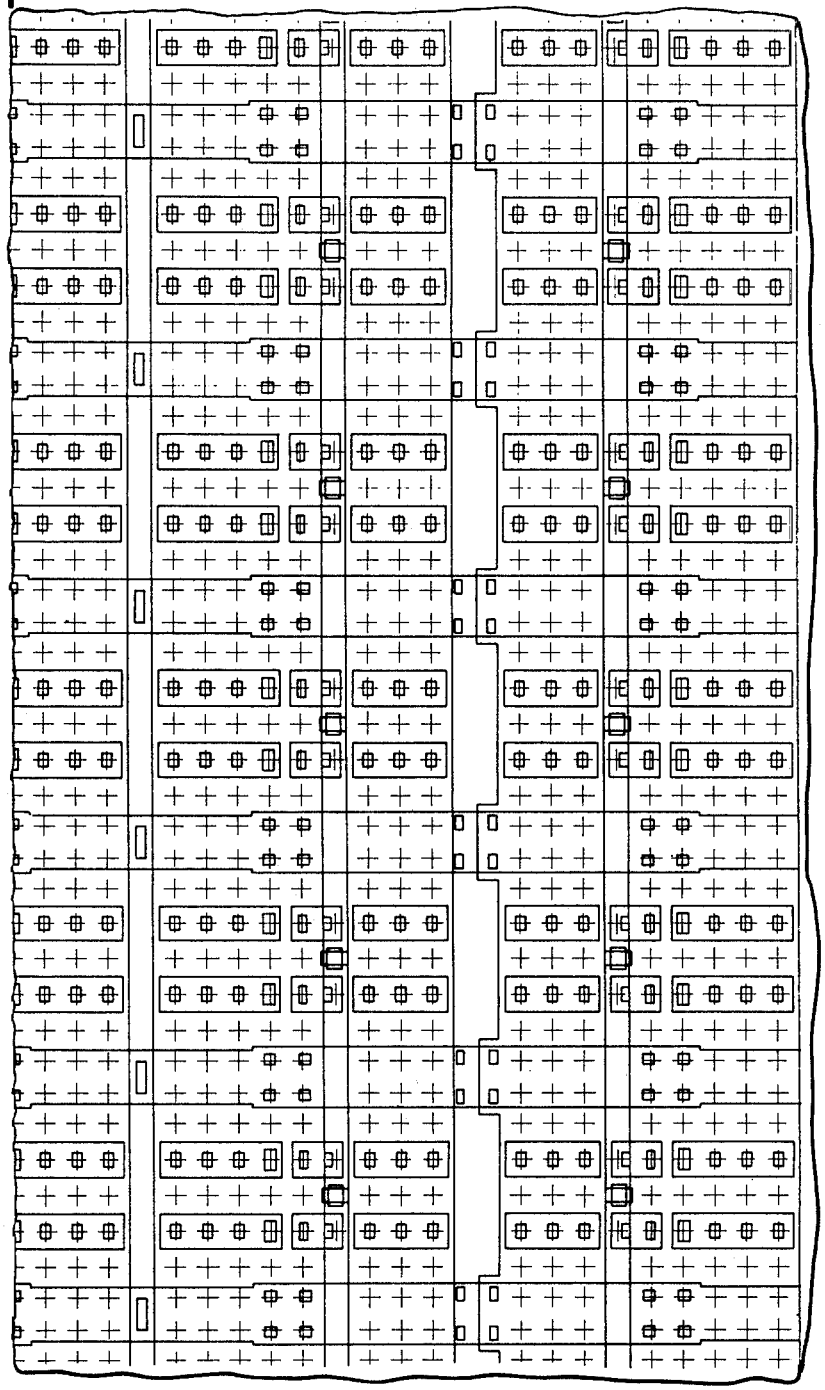

Reference is made to FIG. 2E hereof, which substantially corresponds to FIG. 3 of the drawing in pending U.S. patent application Ser. No. 830,715 (fully identified supra). FIG. 2E is a more detailed drawing of a relatively sizeable number of cells of the first type. More specifically, FIG. 2E may be considered a more detailed showing of a portion of the column-row array of cells of the first type depicted in less detail in the chip cell layout of FIG. 1. In viewing FIG. 2E in conjunction with FIG. 1, it is to be appreciated that cells of the second type as contained in rows R11, R24, R43, etc., have not been represented. As shown and explained herein earlier, the cells are in columnar-row array (see columns C1-C33, rows R1-R104, FIG. 1) and with exception of columns C-0 and C-34 cover the entire planar surface of the chip. As explained earlier herein, columns C-0 and C-34 are utilized to provide driver cells E1 through E-58 and voltage regulator cell VR. In FIG. 2E a representative unit cell of the first type is depicted by the legend "unit cell". Correspondingly, FIG. 2E also contains the representative legends "RB", "RC", "GND", and "+V". Each unit cell of the first type is 4.75 mils in length and 1.65 mils in width. In FIG. 2E no intra-cell wiring (book metal) or intercell wiring is shown. Hence the cells may be considered to be potentially wireable cells to provide active circuits for interconnection by intercell wiring into larger active circuits for providing a predetermined useful function.

As stated earlier herein, resistor RB of wired cells of the first type is connected between the base of its associated transistor T1 and a first level potential buss +V. Resistor RC (when desired) in wired cells of the first type is connected between the collector of its associated transistor T1 and a first level potential buss +V. The emitter of the transistor of wired cells of the first type is connected to a first level potential buss GND.

Figure 2F:
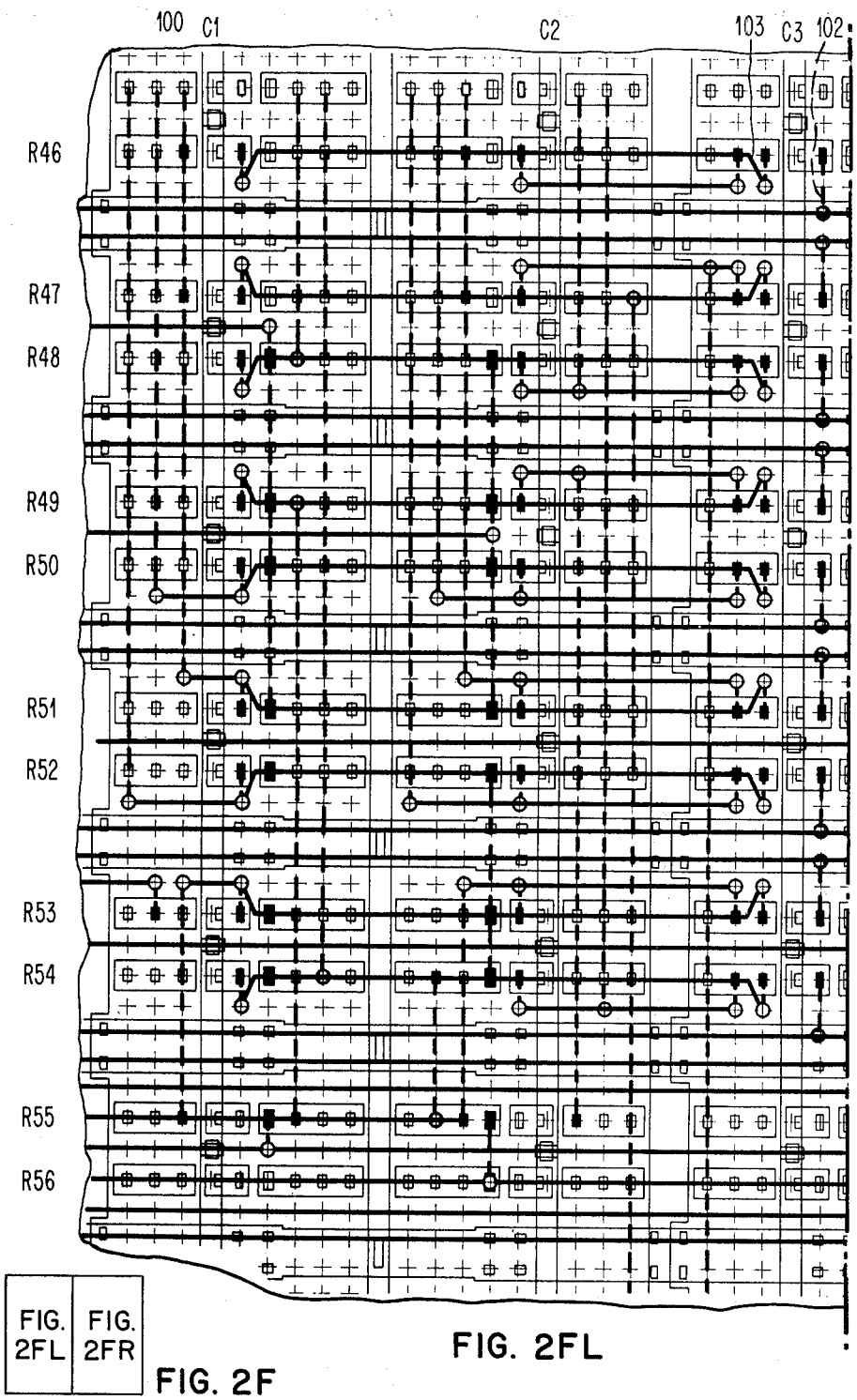
FIG. 2F, a composite of FIG. 2FL and FIG. 2FR, is an enlarged relatively detailed view of a portion of a wired semiconductor chip cell layout, in accordance with the invention, and as depicted in FIG. 1.
Figure 2F:
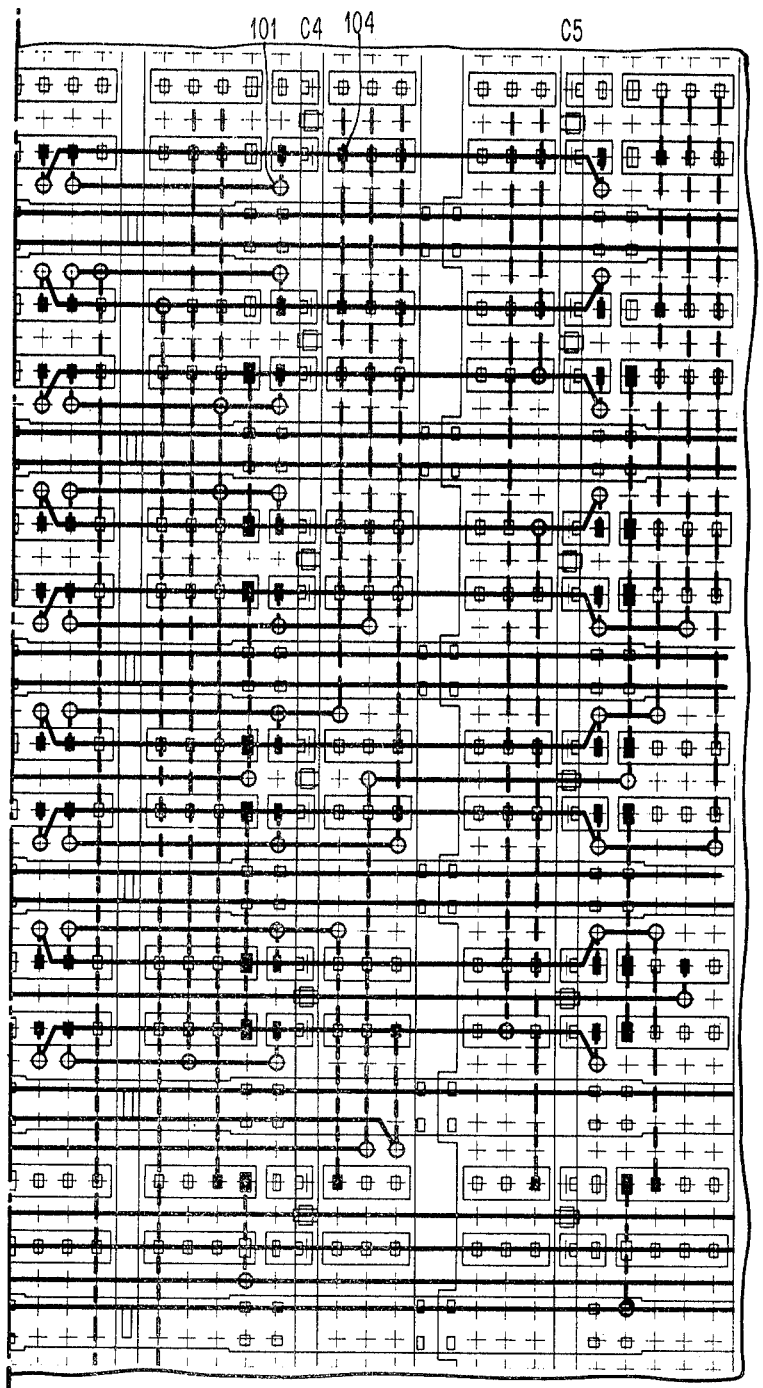

FIG. 2F, which substantially corresponds to FIG. 4 of the drawing of Ser. No. 830,715, illustrates a portion of a wired semiconductor chip cell layout, in accordance with the invention, and as depicted in FIG. 1. The wired portion shown in FIG. 2F contains 5 columns and 11 rows of cells of the first type and may, for convenience of explanation, be considered to be the cells of columns C1 through C5 of rows R46 through R56 of the chip cell layout of FIG. 1. The wired cells of FIG. 2F provide an integrated circuit for performing the logic macro function of an input bus selector, or decoder. In operation, the integrated circuit of the bus selector receives signals from chip receivers (wired cells of the first type), decodes the signals and conveys signals to various other functional circuits (wired cells of the first type) within the semiconductor chip having the cell layout of FIG. 1.

In FIG. 2F, the broken or dashed lines extending in the Y, or columnar direction, represent first level wiring or metallization. The solid lines extending in the X, or row direction, represent second level wiring, or metallization. As stated earlier herein, the first level of wiring extends orthogonally to the length direction of each cell of the first type and also orthogonally to the direction of the second level of wiring. The first level of wiring is separate from the surface of the semiconductor by insulating layer 31 and from the second level of wiring by insulating layer 34. Interconnections from the first level of metallization, or wiring, to the active semiconductor regions within a cell are made through appropriately placed metal filled contact openings, or personalized contacts, in the insulating layer interposed between the first level wiring and the surface of the semiconductor chip. (See for a representative example, the personalized contacts depicted in the cross-sectional view, FIG. 2D). Correspondingly, interconnections between wires, or conductors, on the first level to wires, or conductors, on the second level are also made through metal filled openings or vias. The use of conductive "vias" to interconnect wiring levels in semiconductor devices is well known in the art and thus further discussion thereof, is not deemed to be required.

In FIG. 2F the conductive contacts interconnecting the first level wiring to selected active semiconductor regions will also herein be referred to as personalized cell contacts, or personalized contacts. These conductive contacts are represented in FIG. 2F by filled in rectangles, . The filled in rectangle bearing reference number 100 in FIG. 2F depicts one such personalized contact. In this discussion, the term "active" regions is defined as the emitter base and collector of the transistor and the diodes in each of the cells. Referring to the circuit of FIG. 2B (cells of the first type) the emitters of the transistors T1 and both of the resistors RB and RC (where RC is to be employed) are connected for each cell to be wired. For purposes of clarity these connections are not expressly shown in FIG. 2F. Although not expressedly shown in FIG. 2F, cells of the second type, the driver cells E1 through E58 and cell VR are each potentially wireable in essentially like manner.

The conductive "vias" between the first wiring level and the second level of wiring are depicted in FIG. 2F by circles, O,. See for example, the circle bearing reference character 101. It has been found to be preferable, at least in the present state of the art of fabricating semiconductor devices, not to make contacts directly from the second level of metallization to said active regions. Thus, when it is desired to make a connection from the second level to an active region, the second level conductor is first connected through a via, O, in the second insulating layer to a first level conductor. The first level conductor is then connected to the active region by a personalized contact, ▮ , (filled in rectangle) in the first insulating layer. Reference number 102 in FIG. 2F depicts such a connection.

Where the second level conductor is connected to a first level conductor which is in turn, connected to an active region (contact), and where said second level conductor is directly superimposed (crosses over) said active region (contact) the second level conductor is depicted by an oblique line. For example, see reference character 103. The oblique line is utilized in FIG. 2F merely as a convenient technique for clarity of illustration. In actuality, the second level conductor lies directly above the first level conductor and is connected thereto by a conductive via, O, through the second insulating layer. The first level conductor is, in turn, connected to the active region by a personalized contact, ▮ , directly beneath said second level conductor. In FIG. 2F where a second level conductor merely crosses over a first level personalized contact, ▮ , (no electrical connection between said second level and said first level contact) the second insulative layer separates said two conductive surfaces. Reference number 104 designates the representation of this structural condition.

The first level insulation layer 31 (FIG. 2D) may for example, be a composite layer of silicon dioxide and silicon nitride. It will be appreciated that layer 31, may be comprised of any suitable material or materials known in the art. Any one of a number of processes known in the art may be utilized to provide insulating layer 31. By known photolithographic techniques, or the like, properly spaced and positioned contact openings in layer 31 may be provided to expose the desired active regions (contacts to resistor regions, emitter, collector and base regions of transistors, semiconductor surface region for fabrication of Schottky Barrier junctions). The openings through the first insulating layer to the active regions of the semiconductor surface will be rendered conductive contacts or personalized contacts by a metallization process which also provides the first level of metallization. Numerous suitable metallization processes are known in the art and hence no detailed discussion thereof is deemed to be necessary. For example, the first level of metallization process for forming both the ohmic contacts to the transistors and resistors, as well as the non-ohmic contacts to the Schottky barrier diodes may comprise depositing a first layer of chrome having a thickness in the order of 0.1 micron, depositing a second layer of platinum having a thickness in the order of 0.1 micron on the chrome, and followed by a layer of aluminum (or an alloy of aluminum copper) having a thickness in the order of 1.0 microns. Applicants' invention is not to be construed as limited to the utilization of the above metals. The state of the art is such that at least a number of other metals and possibly alloys may be employed by known processes to provide the first level of metallization.

The state of the art is such that numerous materials, processes and techniques are known to the art for fabricating Schottky barrier diodes. Preferably for fabricating Schottky barrier diode junctions having a barrier height in the order of 0.5 volts the Schottky barrier junction contact comprises a thin layer of tantalum, a thin layer of chrome and aluminum metallization thereover. For fabricating such Schottky barrier junctions, reference is made to U.S. patent application Ser. No. 827,912, more fully identified earlier herein and of common assignee herewith. The aluminum comprises the first level of conductive lines or conductors and may be formed in accordance with known conventional masking and etching techniques.

After the first layer of metallization has been formed, a layer of insulating material 34 (FIG. 2B), for example, quartz or other suitable material, is deposited or formed to provide insulation between the second level of metallization to be formed and the first level of metallization. The second level of metallization may be formed of aluminum, or other suitable metal or alloy, a number of which are known to the art. The process and techniques utilized to provide the second level of metallization may be similar or identical to that employed to provide the first level of metallization. A number of suitable metallization processes are known to the art as evidenced by the U.S. Patent Nos. referenced herein supra.

Where connections are to be made from second level conductors of the second level of metallization to first level conductors of the first level of metallization apertures, or via holes, are provided by known techniques in the second insulating layer. These apertures or via holes respectively expose a predetermined portion of an underlying first level conductor. In the process of providing the second level conductors these via holes are filled with metal to respectively provide an electrical connection between predetermined ones of said second level conductors to predetermined ones of said first level conductors.

Correspondingly, where connections are to be made from first level conductors of the first level of metallization to active regions of the semiconductor surface contact openings are provided by known techniques in the first insulating layer. These contact openings respectively expose a predetermined portion of an underlying region on the semiconductor surface in a particular unit cell. In the process of providing the first level conductors, these contact openings are filled with metal to respectively provide conductive (personalized) contacts between a predetermined one of said first level conductors and the underlying active semiconductor region.

Figure 9:
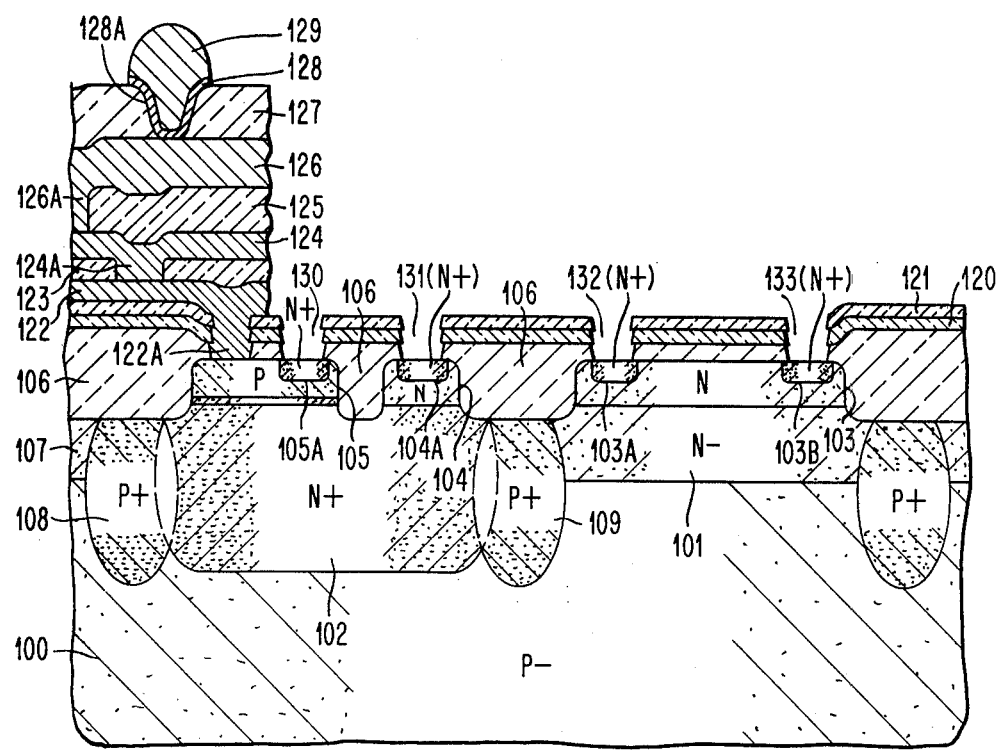
FIG. 9 is an enlarged cross-sectional view of a small portion of a semiconductor device in accordance with the invention and specifically illustrating the four levels of metallization.

Reference is made to FIG. 9 which shows in cross-sectional view an illustrative small portion of a large scale integrated device in accordance with the invention. The structure shown in FIG. 9 depicts a cross-section of the silicon chip, including epi layer, the doped regions, the four metallization levels, a personalized contact, two conductive vias, a C-4 contact and the one intervening insulating layers of the selected portion of the large scale integrated device. The P-substrate 100 has an N-epi layer 101, an N+ subcollector 102. The N-epi layer 101 has N+ region 103, N-region 104 and P region 105. Regions 103, 104 and 105 are spaced apart in the order recited in the epi layer and respectively electrically isolated one from another by recessed oxide isolation (ROI) 106. P+ isolation regions 108 and 109 respectively isolate N+ subcollector region 102 from N-regions 107 and 101. It will be noted that region 105 and 104 are isolated one from another by oxide isolation region 106 and are respectively integrally formed on the semiconductor surface above the subcollector 102. N+ region 103 is integrally formed on the N-epi semiconductor surface and separated by P+ isolation from the subcollector 102. Silicon nitride ($Si_3N_4$) layer 120 is superimposed on recessed oxide layer 106. Pyrolytic oxide ($SiO_2$) layer 121 is superimposed on silicon nitride layer 120. Reference characters 130, 131, 132 and 133 respectively designate "contact openings" in silicon nitride and oxide layers 120, 121. These contact openings respectively expose active semiconductor regions 150A, 104A, 103A and 103B. Conductor 122, which is a portion of the first level of metallization, is carried by the first insulating layer which is a composite layer comprised of silicon nitride layer 120 and silicon dioxide layer 121. It will be noted that integrally formed with conductor 122 is personalized contact 122A which electrically connects the conductor to active semiconductor region 105. It is to be appreciated that the term personalized contact as used herein designates contact opening which have been rendered conductive by being filled with a conductive metal or alloy. As stated earlier, providing the personalized contacts is an integral portion of the semiconductor process and in accordance with the invention is vital to achieve the high density wiring of the LSI semiconductor chip. This feature of the invention is further addressed hereinafter. The second insulating layer 123 overlies the first level of metallization (conductor 122). Conductor 124, which is a portion of the second level of metallization is supported by second level insulating layer 123. The second level insulating layer 123 may be formed by any one of a number of known processes and may be any one of a number of suitable materials known to the art. The second level insulating layer is preferably silicon dioxide formed by a known evaporation or deposition process. Reference character 124A depicts a conductive via which electrically connects second level conductor 124 to first level conductor 122. Conductor 126, which is a portion of the third level of metallization is supported by the third insulating layer 125 which is superimposed over the second level of metallization. Reference character 126A depicts a conductive via which electrically connects third level conductor 126 to a second level conductor 124. A fourth insulating layer 127 is superimposed over the third level of metallization. A fourth level of metallization is depicted by a single C-4 contact (or joint) 129. The fourth level of metallization includes a plurality of contacts only one of which, 129, is shown in the cross-sectional view of FIG. 9. The contact 129 including ball limiting metallurgy 128 is connected through an opening, or via, in layer 127 to third level conductor 126.

Figure 10:
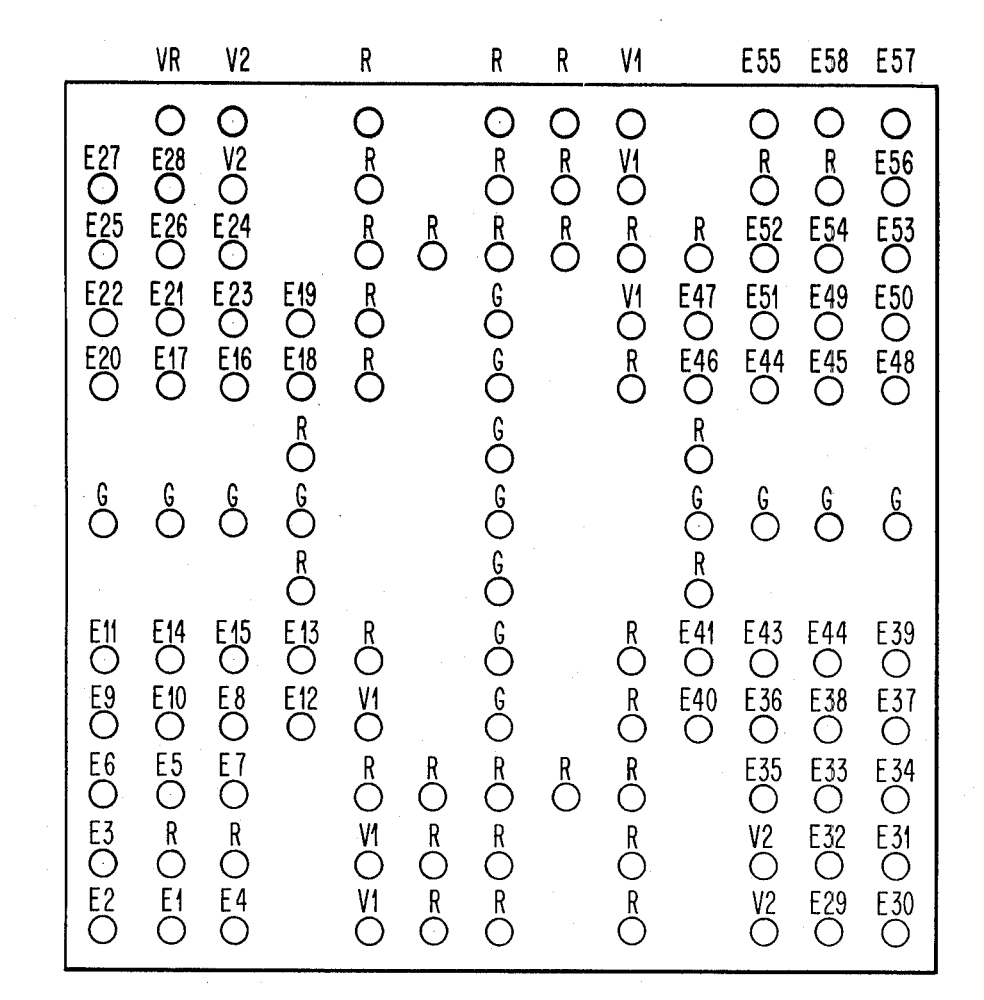

FIG. 10 shows an enlarged planar view of the fourth level of metallization of the completely fabricated semiconductor device in accordance with the invention. The fourth level of metallization is an array of pads, one hundred and twenty-one in number, which are utilized to connect in a predetermined manner through conductors in the third, second and first levels of metallization and via personalized contacts to active regions of predetermined cells of the semiconductor chip layout of FIG. 1. (A single such pad is depicted in FIG. 9 by reference character 129.) The fifty-eight pads bearing reference characters E1, E2, - - - to E58 may be termed "Driver/Receiver Signal I/O pads" and are available to provide electrical connection to the wired driver circuits of cells E1 through E58 or to wired receiver cells of FIG. 1. The six pads bearing reference character V1 may be termed "Power I/O pads" and are utilized to provide a first potential, for example, +1.7 volts, to wired cells of the chip. The four pads bearing reference character V2 may also be termed "Power I/O pads" and are utilized to provide a second potential, for example, +5 volts, to wired cells of the chip. The thirty-seven pads bearing reference character R may be termed "Receiver Signal I/O pads" and utilized to provide electrical connection to wired receiver cells of the chip. The pad bearing reference character VR may be termed the "Voltage Regulator/Receiver I/O pad" and is utilized to provide electrical connection to the wired voltage regulator cell VR of the chip. Further, if the pad VR is not used to provide electrical connection to the cell VR it may be used to provide electrical connection to a receiver cell, or cells. In summary, the "footprint" is an array of solderable pads or contacts, preferably lead/tin, or the equivalent, which utilize intervening wiring levels (one, two and three) contained on the chip to provide an electrical connection between the large scale integrated circuit contained on the silicon surface of the chip and circuitry external thereto.

Figure 11A:
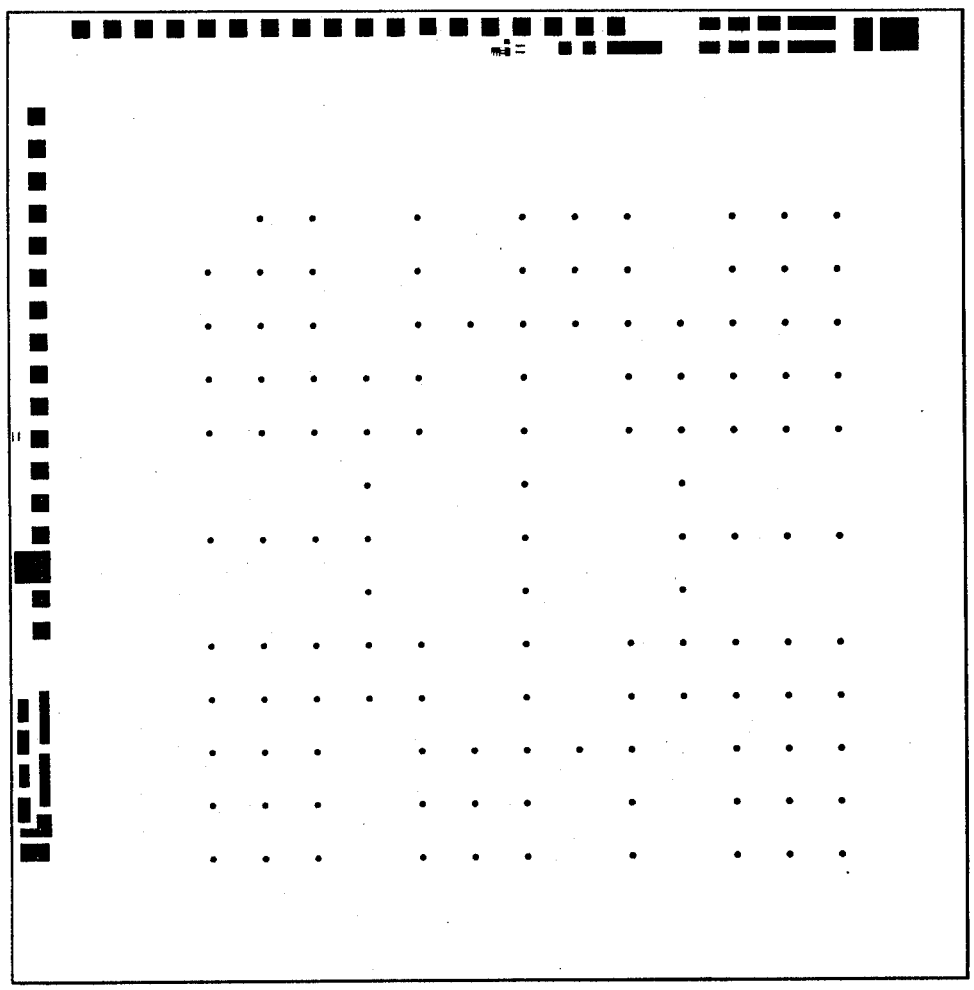
FIG. 11A depicts a plan view of a mask for providing via holes in the fourth insulating layer utilized in connecting the third level of metallization to the fourth level of metallization (or footprint) depicted in FIG. 10.

FIG. 11A is a plan view of a mask utilized to provide via holes in the fourth insulating layer 127, FIG. 9. It will be noted that the array of via holes depicted in FIG. 11A correspond to the array of pads depicted in FIG. 10. Referring to FIG. 9, it will be appreciated that each pad of FIG. 10 is seated in and extends through a via hole (FIG. 11A) to a conductor in the third level of metallization. In FIG. 9 only a single pad 129 is shown as extending through an opening, or via hole in the fourth insulating layer 127 to a third level conductor 126.

Figure 11B:
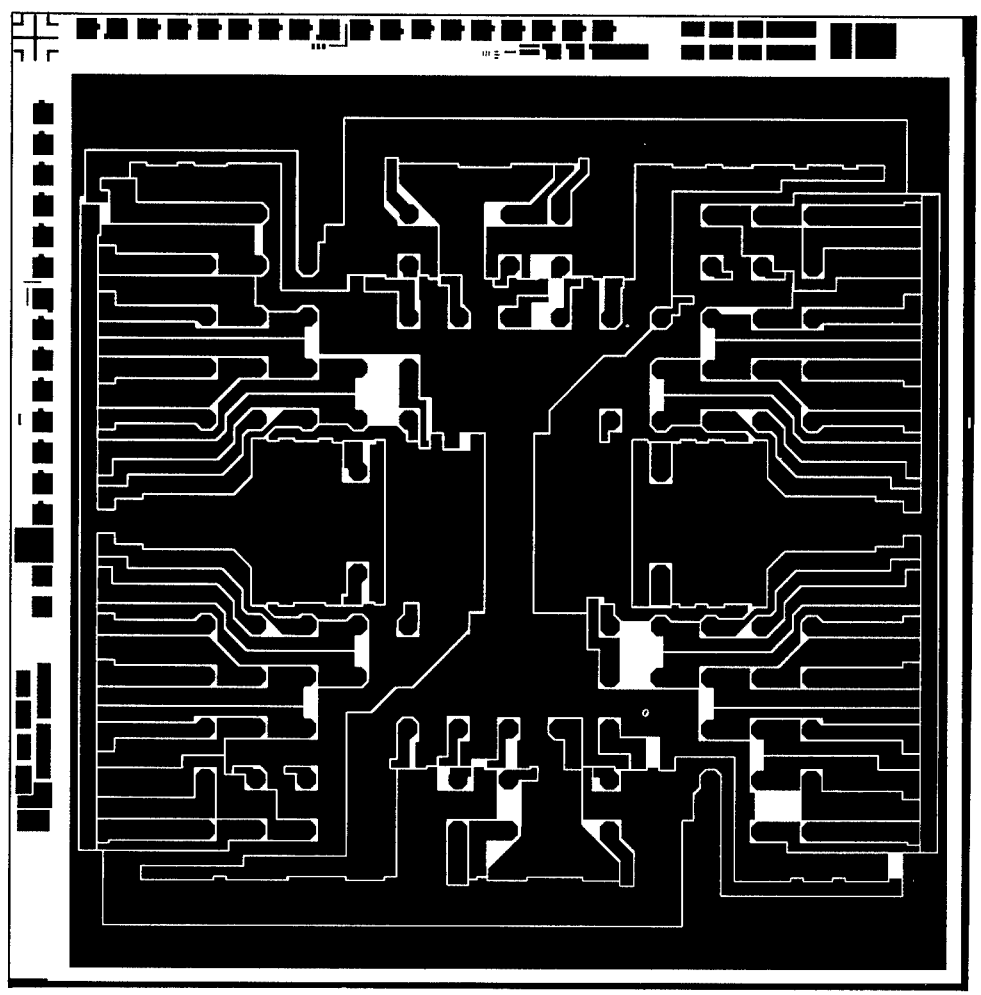
FIG. 11B depicts a plan view of an illustrative mask for providing the third level of metallization.

FIG. 11B is a plan view of a mask utilized to provide the conductors of the third level of metallization. The integral dark areas in FIG. 11B respectively depict third level conductors. From an inspection of FIGS. 10, 11A and 11B it will be seen that the conductive pads of the footprint are connected to predetermined conductors of the third level of metallization. It is to be appreciated that certain third level conductors are commonly connected to more than one pad in the array of pads of FIG. 10. For example, certain of the ground third level conductors are connected to a plurality of ground pads G. Also, certain of the power pads V1 and V2 respectively, are commonly connected by a third level conductor.

Figure 11C:
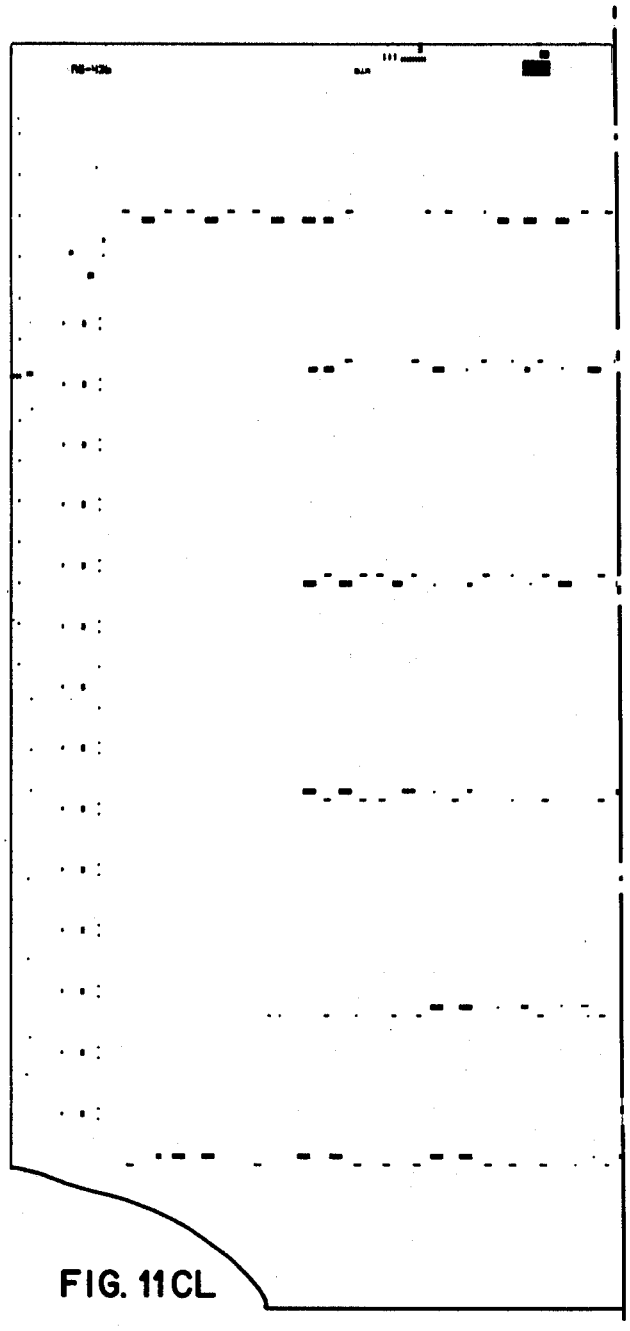
FIG. 11C, a composite of FIG. 11CL and FIG. 11CR depicts a plan view of an illustrative mask for providing the via holes in the third insulating layer utilized in connecting the second level of metallization to the third level of metallization.
Figure 11C:
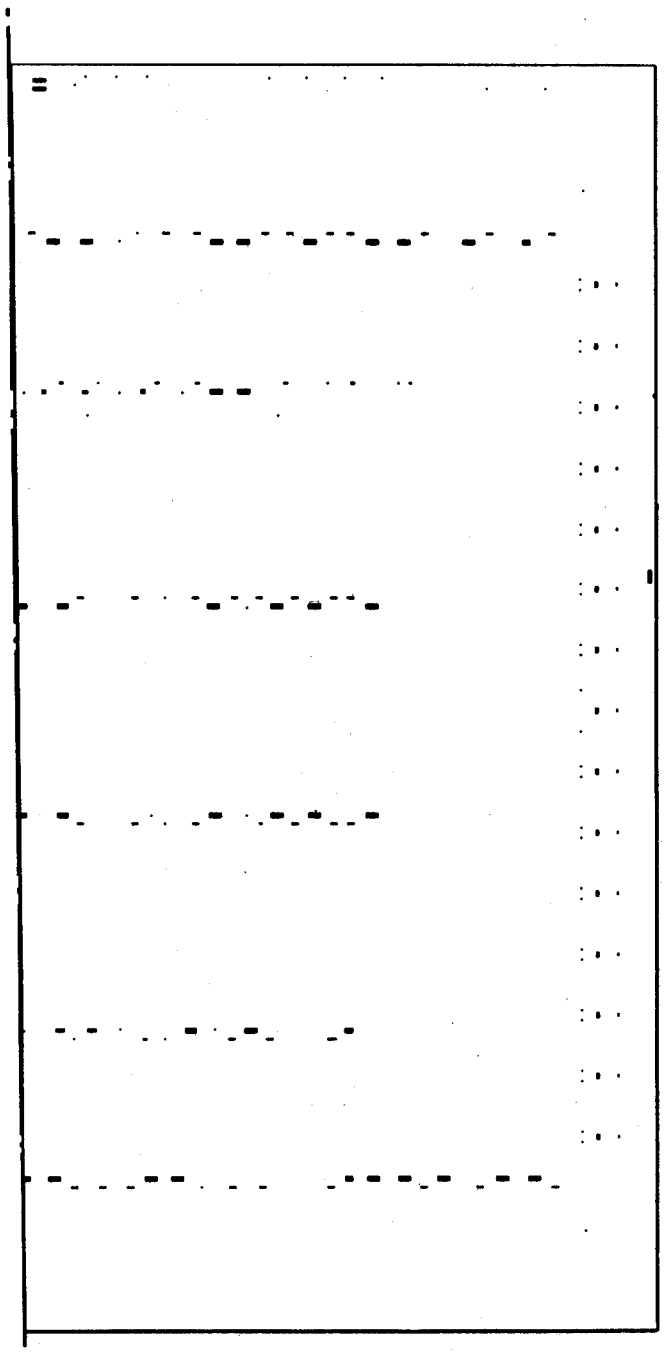

FIG. 11C is a plan view of a mask utilized to provide via holes in the third insulating layer 125, FIG. 9. The via holes depicted in the mask of FIG. 11C are utilized, when filled with metal, to provide electrically conductive paths from predetermined conductors, or signal pads, in the second level of metallization to predetermined conductors in the third level of metallization.

Figure 11D:
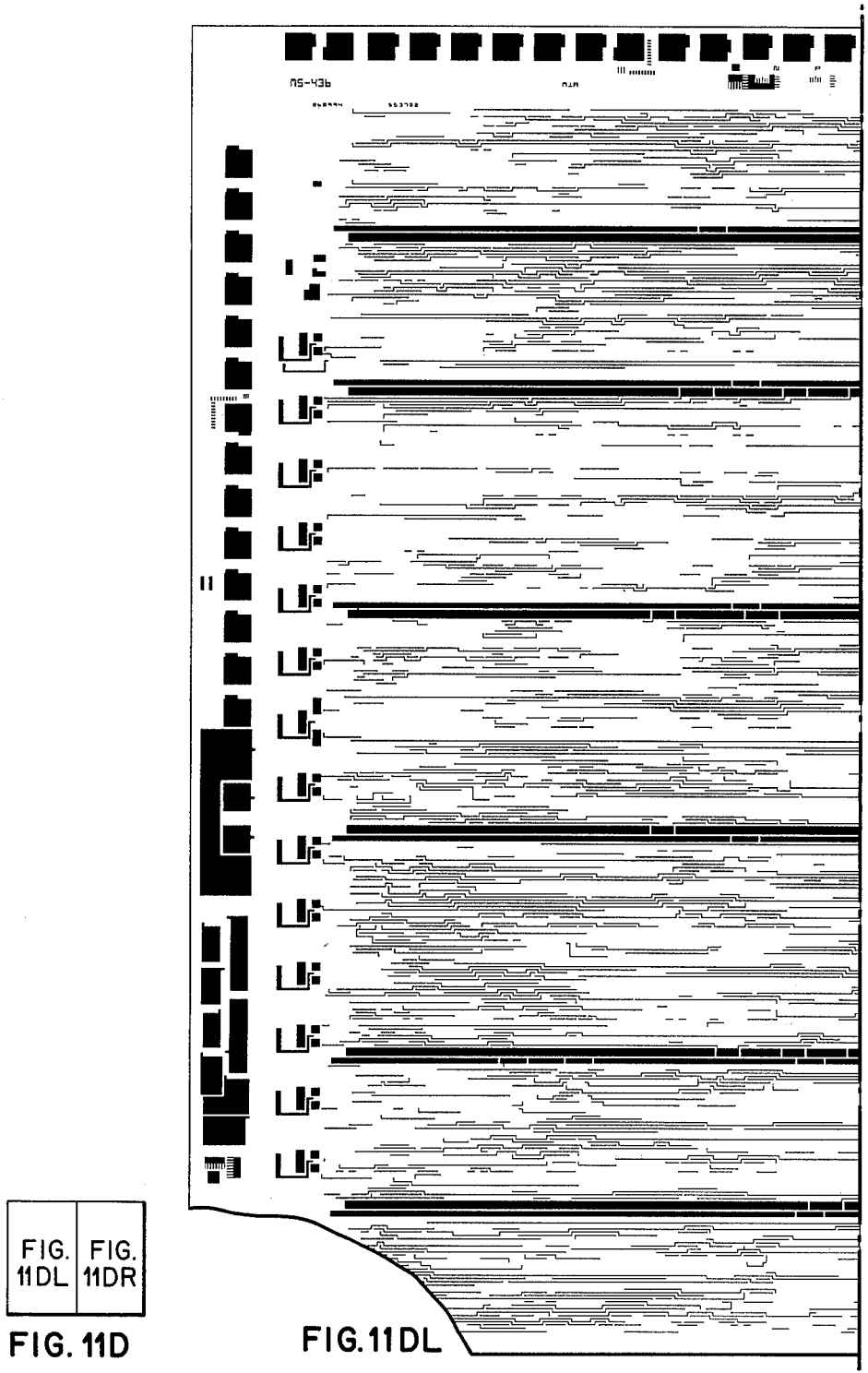
FIG. 11D, a composite of FIG. 11DL and FIG. 11DR, depicts a plan view of an illustrative mask for providing the second level of metallization.
Figure 11D:
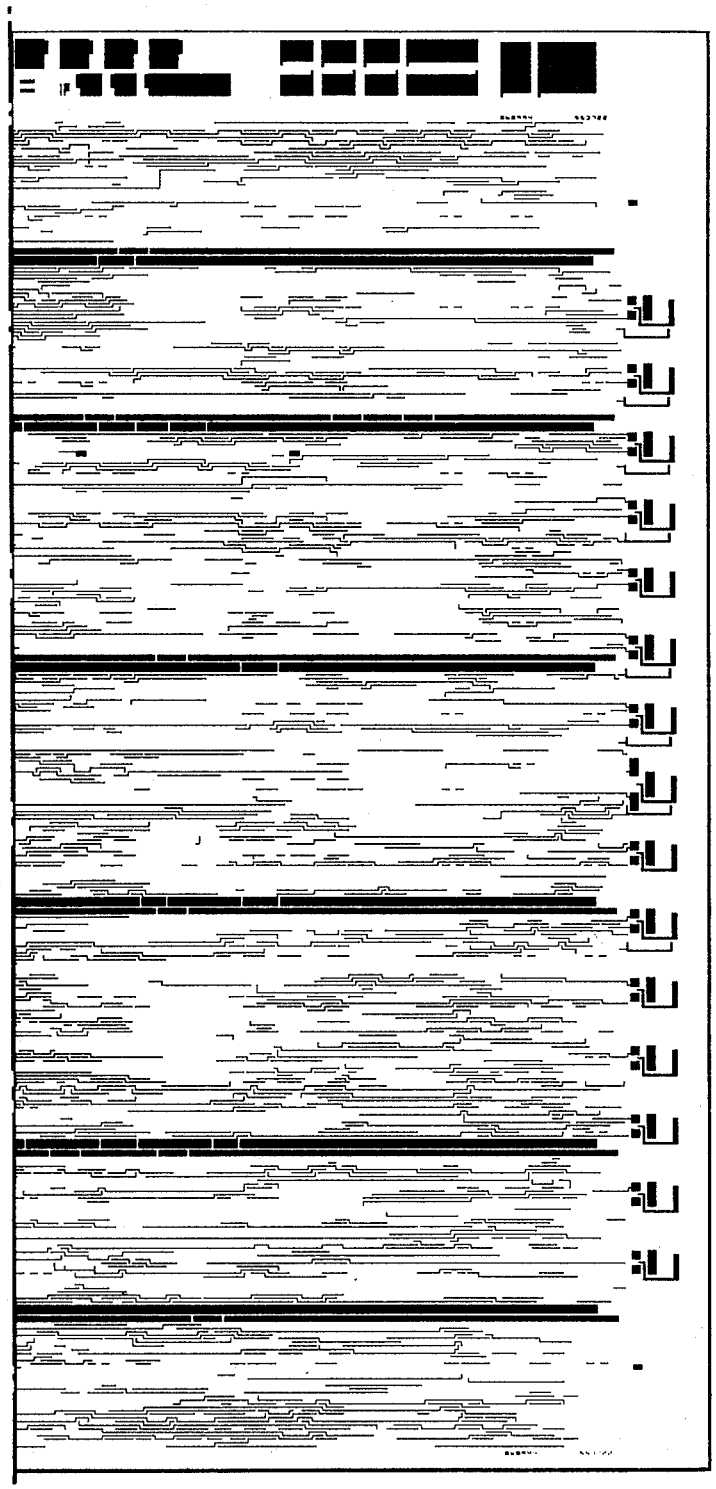

FIG. 11D is a plan view of a mask utilized to provide the conductors of the second level of metallization. The mask depicted in FIG. 11D is representative in that each "part number" to be fabricated will require a more or less unique mask. Namely, the mask for providing the second level wiring for a first part number device and the mask for providing the second level wiring for a second part number device will contain non-identical wiring patterns. There will admittedly be a similarity in the masks in that each will possess like or very similar patterns for providing voltage (power) and ground busses. However, the intercell wiring depicted on each mask will correspond to the intercell wiring of the part number to be fabricated. Thus, the mask depicted in FIG. 11D utilized to provide the second level wiring is termed representative.

Figure 11E:
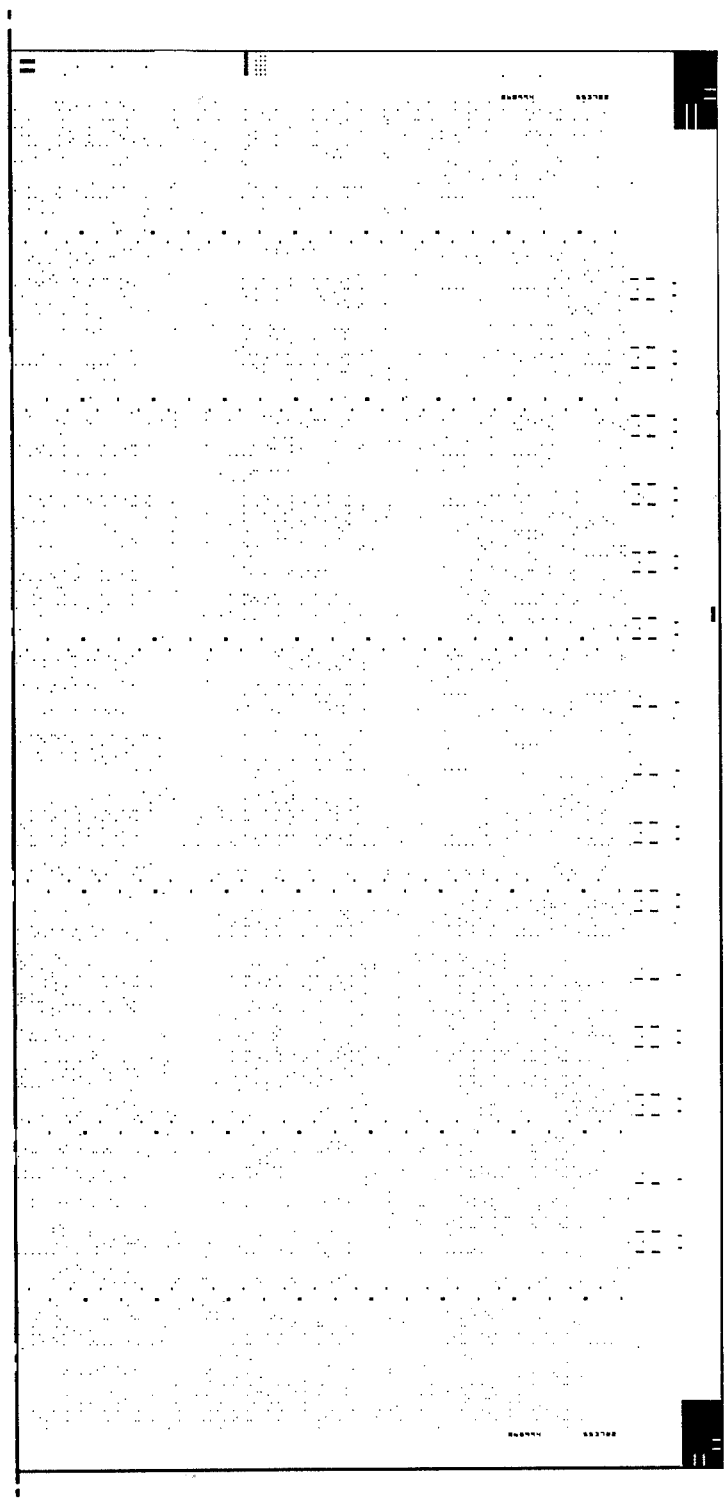
FIG. 11E, a composite of FIG. 11EL and FIG. 11ER, depicts a plan view of a mask for providing the via holes in the second insulating layer utilized in connecting the first level of metallization to the second level of metallization.

FIG. 11E is a plan view of a mask utilized to provide the via holes in the second insulating layer 123, FIG. 9. As explained supra, the mask depicted in FIG. 11E is also termed representative in that each "part number" to be fabricated will require a more or less unique mask. The via holes depicted in the mask of FIG. 11E are utilized, when filled with metal, to provide electrically conductive paths from predetermined conductors in the first level of metallization to predetermined conductors in the second level of metallization.

Figure 11F:
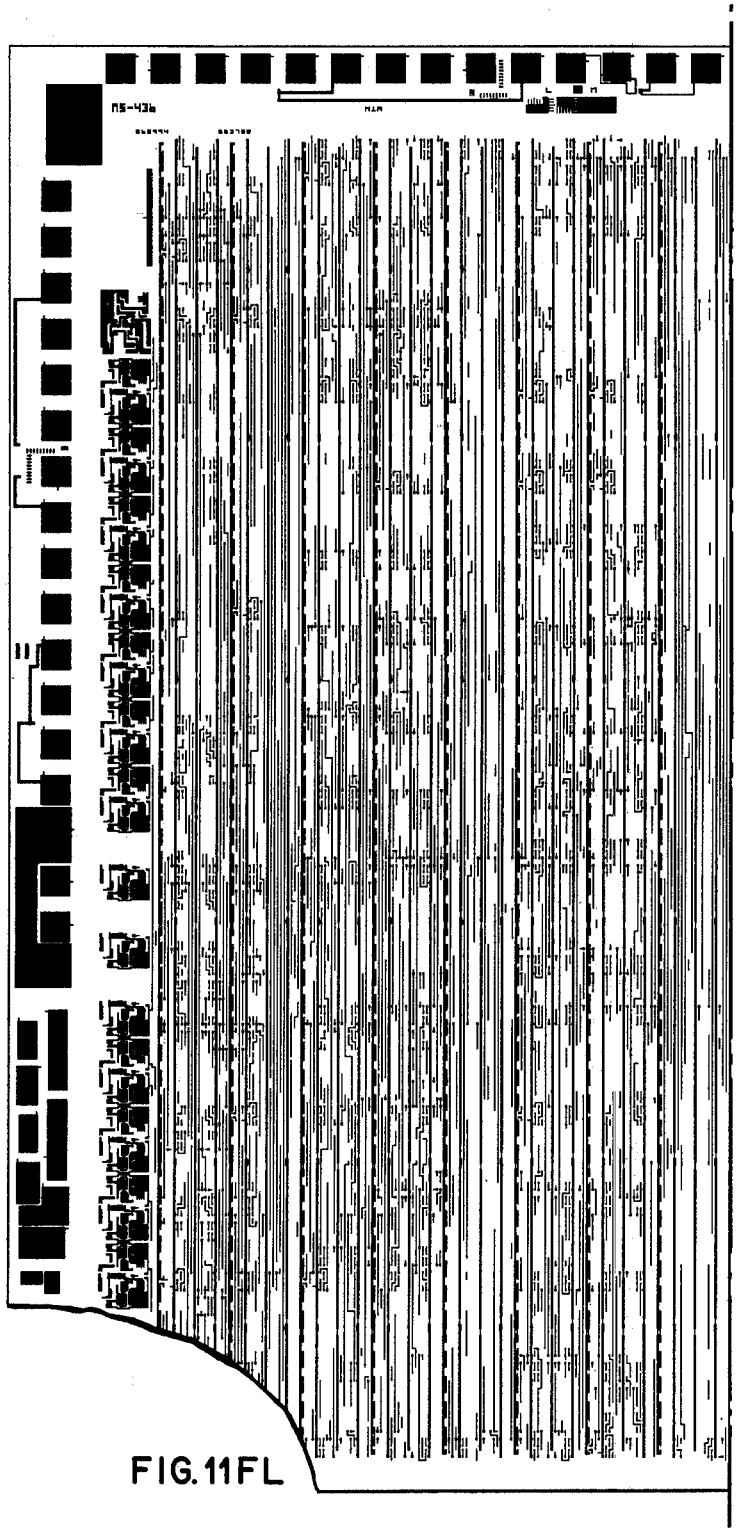
FIG. 11F, a composite of FIG. 11FL and FIG. 11FR, depicts a plan view of an illustrative mask for providing the first level of metallization.
Figure 11F:
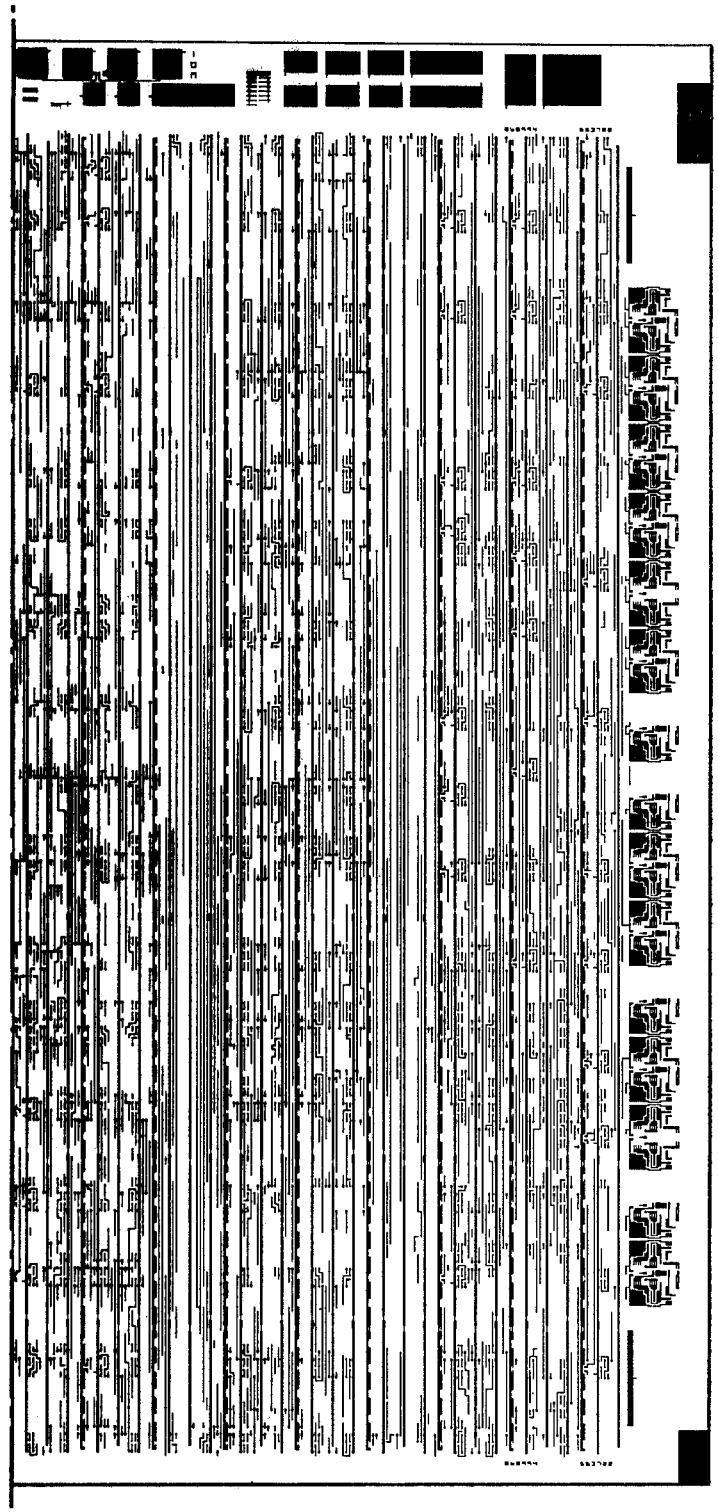

FIG. 11F is a plan view of a mask utilized to provide the conductors of the first level of metallization. This mask is also termed representative in that the intra-cell and inter cell wiring and the particular cells to be wired will vary from part number to part number. All masks for providing the first level wiring for the various part numbers will be identical, or essentially so in providing the ground and voltage busses. Namely, the heavier more pronounced vertical lines in FIG. 11F. However, the intra-cell and intercell wiring depicted in the mask of FIG. 11F by the less pronounced and frequently interrupted lines will materially differ from "part number" to "part number".

Figure 11G:
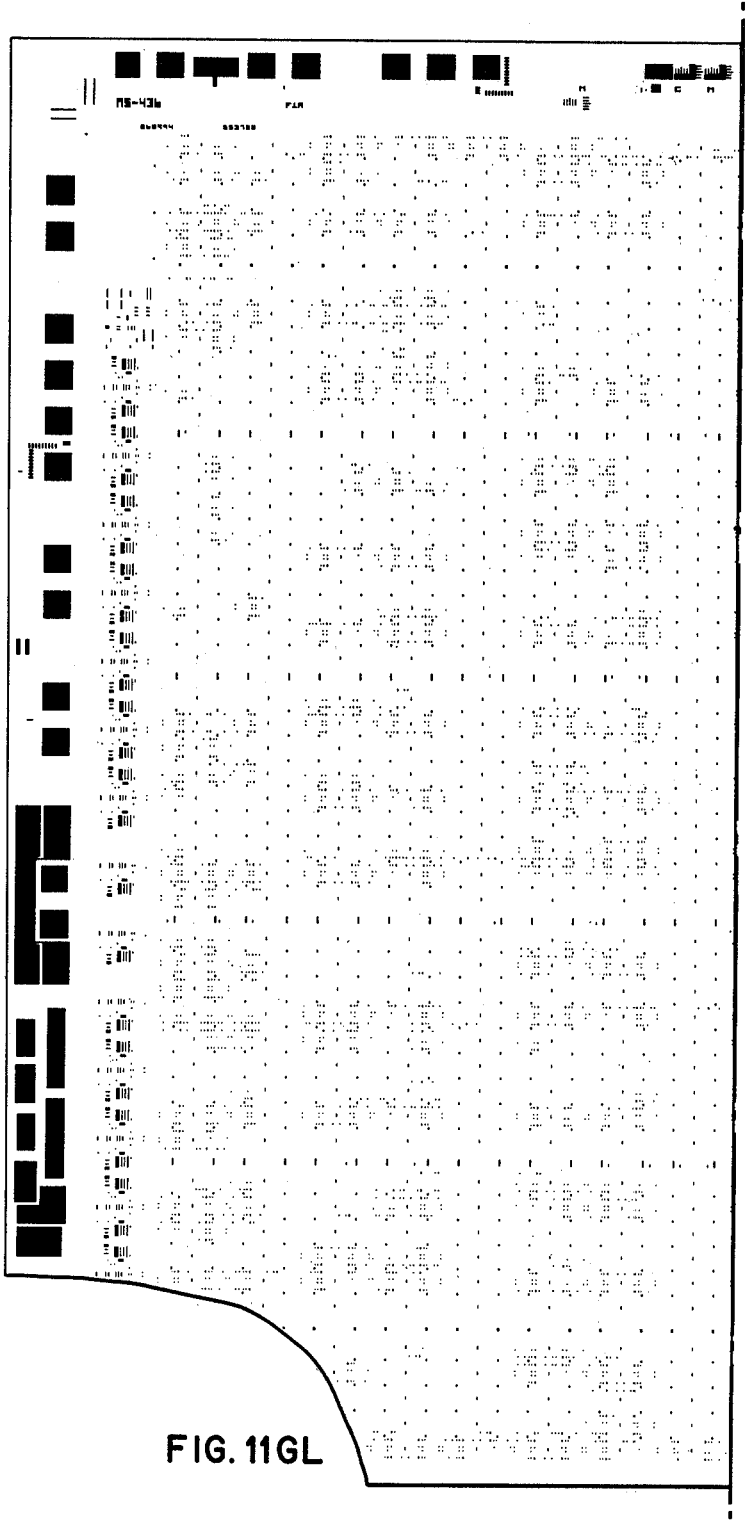
FIG. 11G, a composite of FIG. 11GL and FIG. 11GR, depicts a plan view of a mask for providing the contact openings in the first insulating layer from the first level metallization to the active regions of the semiconductor chip surface.
Figure 11G:
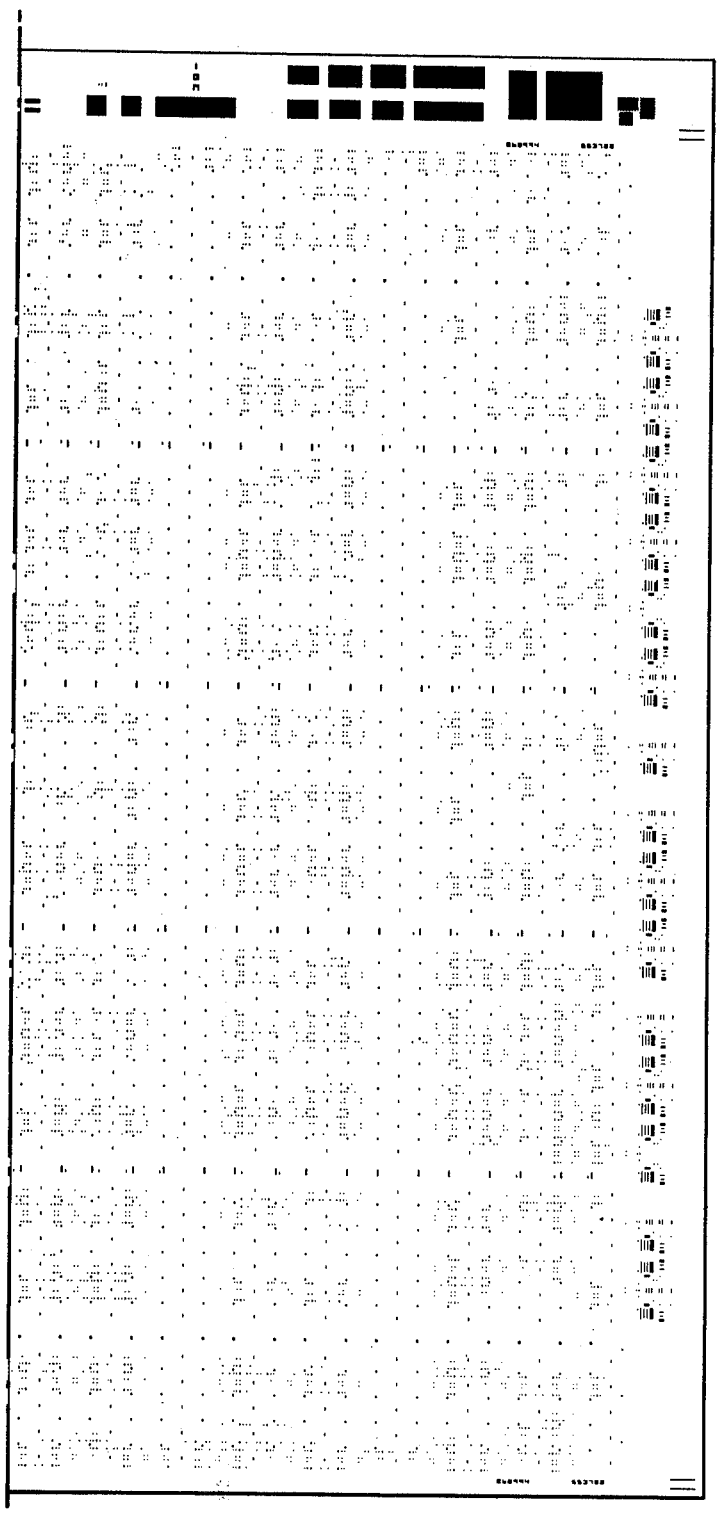

FIG. 11G is a plan view of a mask utilized to provide the contact openings in the first insulating layer 120, 121, FIG. 9. This mask is also termed representative in that the via hole pattern in the first insulating layer will vary extensively from one part number to another. The pattern of contact openings in the first insulating layer for each part number will be in accord with the contacts to be personalized to provide the particular part number device desired.

Referring to FIGS. 12A, 12B, 12C and 12D, the basic steps of the semiconductor process used to manufacture the large scale integrated devices, in accordance with the invention, will be described. It is to be appreciated that for conciseness and clarity known routine steps, such as cleaning the semiconductor wafer surface, etc., will not be expressly recited. Further, the photolithographic techniques, particular etchants employed, etching techniques, diffusion techniques, oxide layer forming techniques, etc., will not be expressly disclosed in detail, since these materials, techniques, procedures, etc., per se, or their equivalent, are well known to the art.

Individually, each of the steps of the manufacturing method which will be described below in relative detail is similar to or in accordance with the known state of the semiconductor process art. However, these individual steps will be described herein for completeness of disclosure of the method utilized in accordance with the invention. The improvement of the method, in accordance with the invention, is in the portion of the method or sequence of the process steps related to the so called "Personalized levels". The order and the specific manner in which the steps of the "personalized levels" of the manufacturing method (utilized in accordance with the invention and described herein) are performed is essential to achieve the specified large scale integrated device (part number) and the high level of circuit density and wiring density on the semiconductor LSI chip.

Figure 12A:
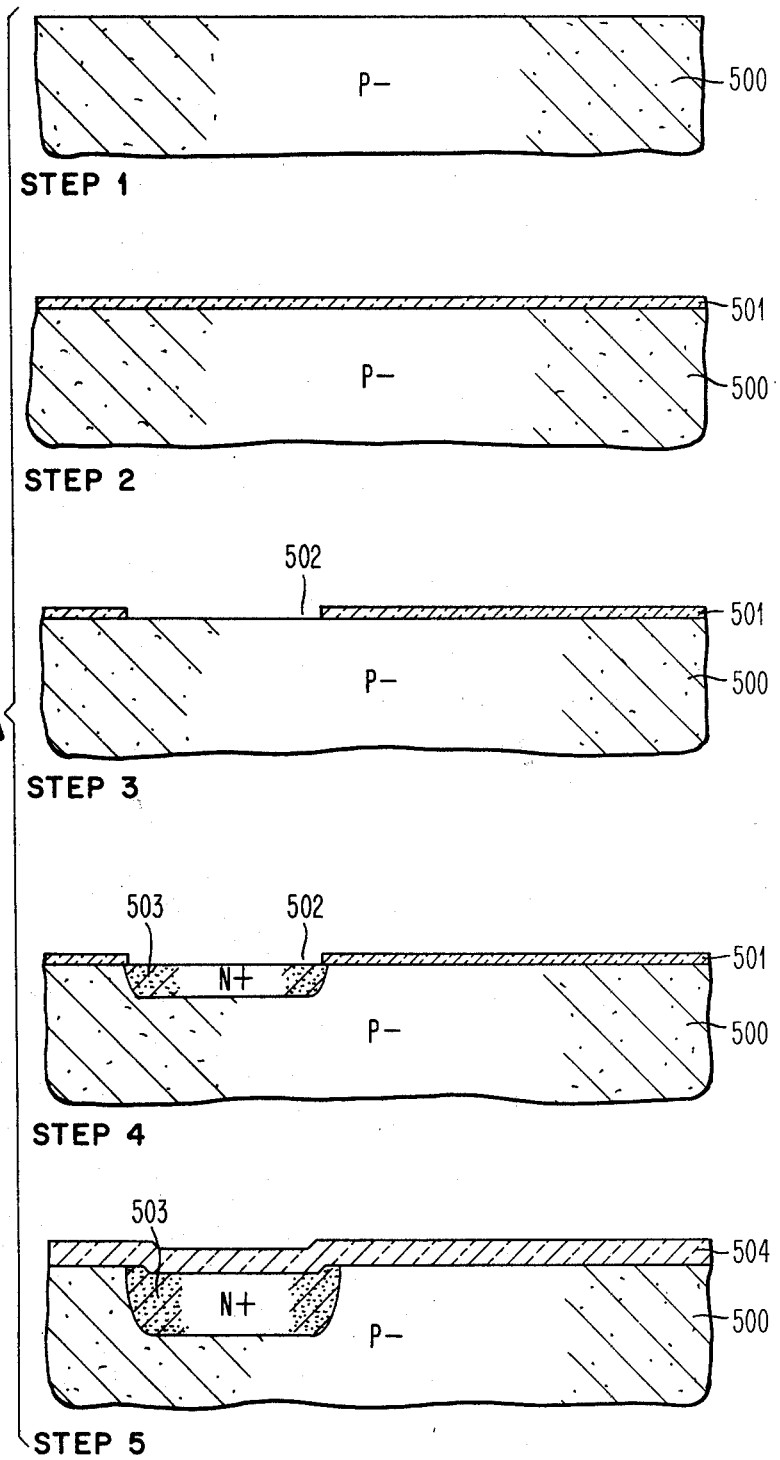
FIGS. 12A, 12B, 12C and 12D depict diagrammatic cross-sectional views of a portion of a large scale integrated device in accordance with the invention at successive stages or steps of fabrication.

In step 1, FIG. 12A, a semiconductor substrate (a wafer) 500 having P−type doping is provided.

In step 2, FIG. 12A, a diffusion mask 501 is formed over the entire planar surface of the semiconductor substrate 500. This subcollector diffusion mask is preferably a layer of thermally grown $SiO_2$ (silicon dioxide) of a thickness preferably in the order of 15 micro inches (15 millionths of an inch). However, it is to be appreciated that materials other than $SiO_2$, which are known in the art, may be employed.

In step 3, FIG. 12A, an opening or window 502 in the oxide diffusion mask 501 is provided. In the drawing only a very small portion of the substrate (semiconductor wafer) and only one window for the subcollector diffusion is shown. However, it is to be appreciated that there are many, in the order of thousands, such windows in the diffusion mask 501. This is in accordance with the invention and the large scale integrated device design which is described in detail earlier herein. Limiting the numbers of openings, regions or diffusion etc., on these drawings is for simplicity and clarity. In actual design, it should be clear that the number of such regions would be in the order of thousands for a large scale integrated device. The windows 502 are utilized in diffusing N+ impurities into the semiconductor surface to provide subcollector regions. Windows 502 as is known in the art, are provided by utilizing known photolithographic and chemical etching techniques.

In step 4, FIG. 12A, shows an N+ subcollector diffused region 503. As stated earlier, the subcollector regions are provided by diffusing N+ impurities through windows 502 of mask 501 into the exposed surface of substrate 500. The subcollector regions are doped with N+ type dopant (preferably arsenic) to an initial depth preferably in the order of 60 microinches (60 millionths of an inch).

In step 5, FIG. 12A, a layer of silicon dioxide ($SiO_2$) 504 is grown, by known thermal processes, to a thickness preferably in the order of 20 microinches (20 millionths of an inch). The oxide layer 504 covers the entire planar surface of the substrate 500 including all openings over diffused subcollector regions 503.

Figure 12B:
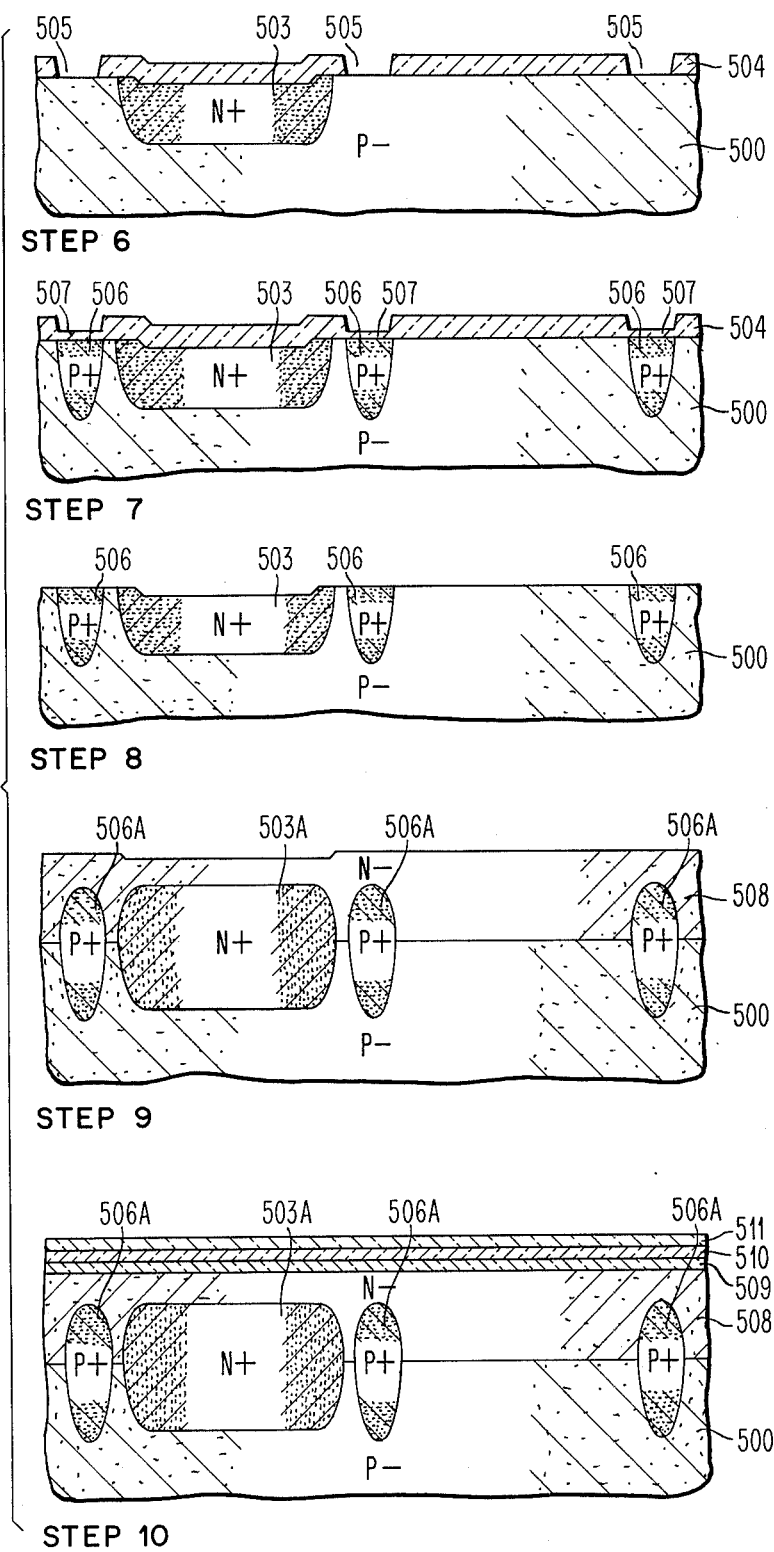

Step 6, FIG. 12B, shows the openings, or windows, 505 in the oxide layer 504. These openings are provided by using a mask called an isolation diffusion mask. The mask includes a pattern of openings 505 corresponding to the isolation regions desired to provide a chip cell structure as depicted in FIG. 1. Known photolithographic and chemical etching processes are employed. The openings, or windows, 505 expose the surface of the semiconductor substrate 500. The windows are employed in providing diffused isolation regions.

Step 7, FIG. 12B, shows the diffused isolation regions 506. The isolation regions are doped with P+ type dopant. Preferably boron, $BBr_3$ may be employed. Note that a thin layer of oxide 507 is formed in the openings 505 during this step. Depth of the diffused isolation region is preferably in the order of 50 microinches.

Step 8, FIG. 12B, shows that the oxide layer 504 including portions 507 is removed from the surface of the substrate 500. Thus, the planar surface of substrate 500 having subcollector regions 503 and isolation regions 506 is exposed.

Step 9, FIG. 12B, shows an N− epitaxial layer 508. The N−epitaxial layer is thermally grown on the exposed planar surface of the substrate 500. This epitaxial layer is doped with an N− type dopant to a resistivity in the order of 0.3 ohm-cm. The thickness of the epitaxial layer is preferably in the order of 2 microns (about 80 microinches).

Note that during the thermal step of providing the epitaxial layer the N+ type subcollector regions 503 have outdiffused into the epitaxial layer. The outdiffused regions of the subcollector are denoted by reference character 503A. Also the P+ type isolation regions 506 have outdiffused into the epitaxial layer. The outdiffused isolation regions are denoted by reference character 506A.

Step 10, FIG. 12B, shows that a layer of silicon oxide ($SiO_2$) 509, a layer of silicon nitride ($Si_3N_4$) 510, and a layer of pyrolytic silicon oxide ($SiO_2$) 511 are formed, in the order recited, over the exposed surface of the epitaxial layer. The silicon oxide layer 509 is thermally grown by utilizing a known thermal process. The silicon nitride layer 510 and pyrolytic silicon oxide layer 511 are deposited by known deposition or sputtering processes.

Figure 12C:
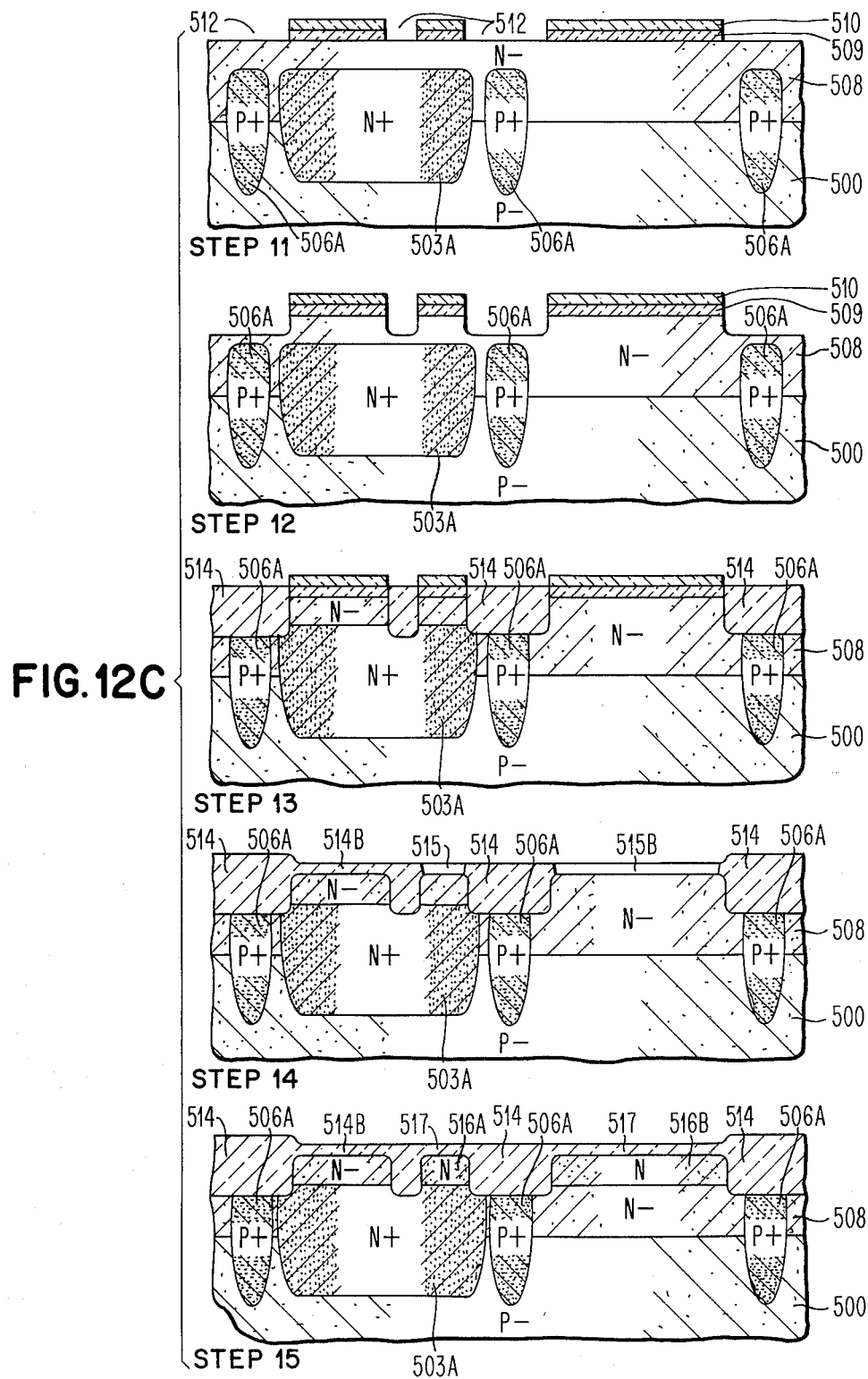

Step 11, FIG. 12C, shows openings, or windows 512, in the insulating layers formed during step 10. The windows 512 expose the surface of the epitaxial layer 508. The openings 512 are provided by using a mask called a recessed oxide mask and utilizing known photolithographic and chemical etching processes.

Step 12, FIG. 12C, shows that portions of the epitaxial layer 508 are etched away in areas exposed by the mask openings 512. These etched away regions, or portions of the epitaxial layer, are marked with reference character 513. The depth of these etched away regions of the epitaxial layer is such that the to be formed recessed oxide layers having a thickness preferably in the order of 1 micron (40 microinches) will be essentially flush with the exposed surface of the substrate.

Step 13, FIG. 12C, shows the recessed oxide layer thermally grown in the etched away regions 513 of the epitaxial layer 508. These recessed oxide layers are denoted by reference characters 514 and 514A. Note that recessed oxide layers 514 extend to the top of the P+ diffused isolation regions 506 and completes the isolation between various devices of the semiconductor wafer from the P− substrate to the exposed surface of the substrate. The recessed oxide layers 514A respectively isolate two regions of the transistor (i.e., base region and the collector reach through region). Formation of the base and collector reach through regions will be completed in subsequent steps.

Step 14, FIG. 12C, shows that the silicon nitride layer 510 is removed from the exposed surface of the substrate, or wafer. The remaining portion of the silicon oxide layer 509 is now shown as an integral part of the recessed oxide layer 514. These portions of remaining oxide layer 509 are denoted by reference character 514B. Also step 14 shows openings denoted by reference characters 515A and 515B. These openings are provided by utilizing an N− resistor and collector reach through diffusion mask and known photolithography and chemical etching processes.

Step 15, FIG. 12C, shows that N type regions 516A and 516B are formed by diffusing N type semiconductor dopant (preferably phosphorous, $POCl_3$) through the openings 515A and 515B. Regions 516A are collector reach through regions. Regions 516B are utilized as resistors. Also a thin silicon dioxide layer is thermally grown over the regions 516A and 516B. This oxide layer is denoted by reference character 517.

Figure 12D:
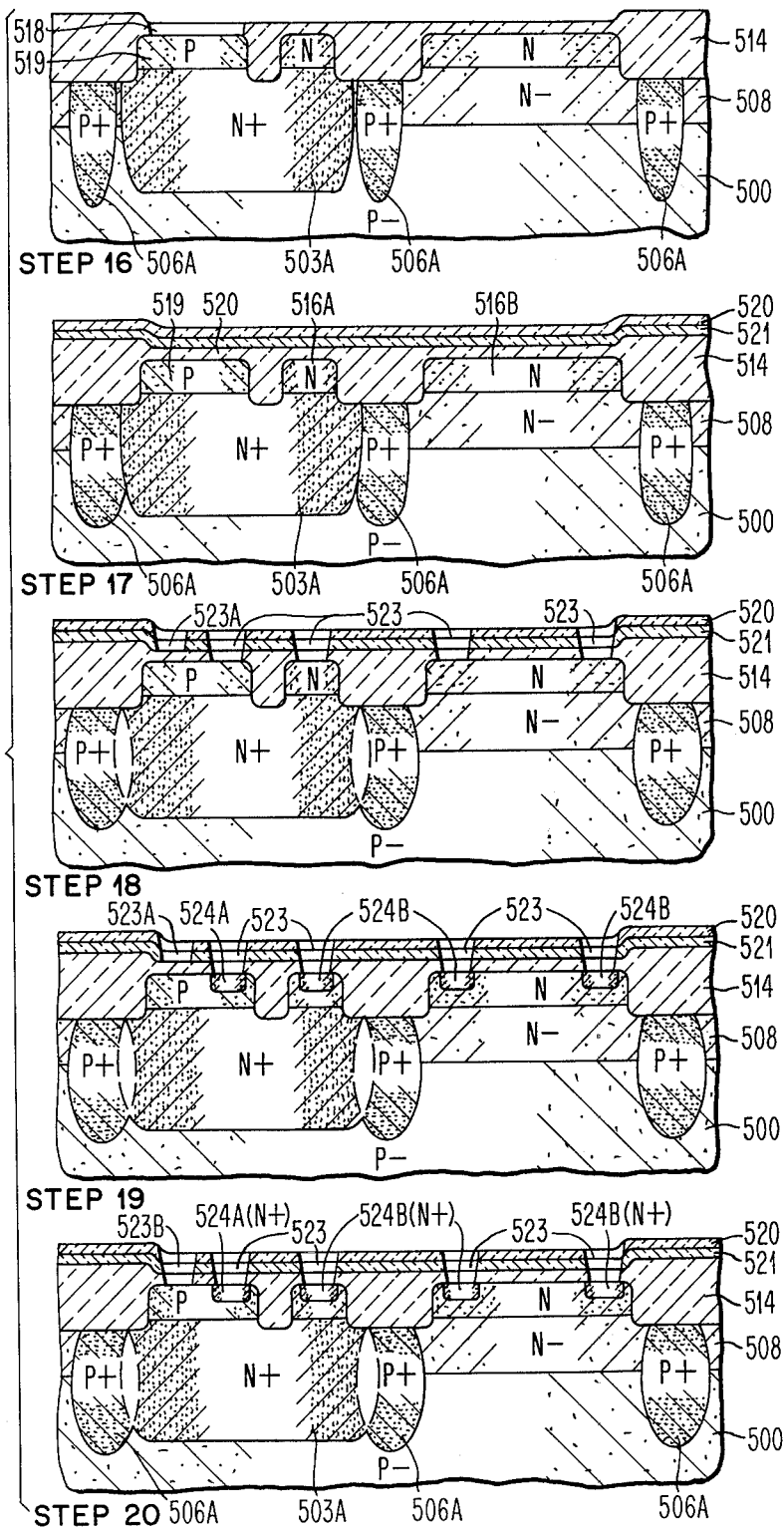

Step 16, FIG. 12D, shows an opening, or window, 518 over the to be formed base region of the transistor. Window 518 is formed using a base diffusion mask and known photolithographic and chemical etching processes. Utilizing a known diffusion process the base regions 519 of the transistors are provided by diffusing P type dopant (preferably boron, $BBr_3$) through the openings 518 of the mask.

Step 17, FIG. 12D, shows that the opening 518 over the base region 519 is covered by thermally growing a layer of silicon oxide 520. The thickness of silicon oxide layer 520 is preferably in the order of 4 microinches (4 millionths of an inch). Also a layer of silicon nitride 521 and a layer of pyrolytic silicon oxide 522 are formed, in the order recited, on the planar surface of the substrate. Known deposition and sputtering processes are employed to provide the silicon nitride layer 521 and pyrolytic silicon oxide layer 522.

Step 17 of the manufacturing method is the final step of the "non-personalized" steps of the large scale integrated masterslice manufacturing process in accordance with the invention.

The following steps, 18 through 20, of the manufacturing method are called the "personalized" steps. They differ from the non-personalized steps in that the design of each mask used in the personalized steps differ from part number to part number. The designs of the masks used for the "non-personalized" steps are identical for all the part numbers.

Personalization of masterslice is done during the so-called "Physical Design" of a particular part number. Physical design meaning the placement, or selection, of all unit circuit cells, which are needed and selected to perform the logical function completely as defined, by the part number, on the masterslice shown in FIG. 1. This (placement) determines which of the unit cells will be utilized for the circuit, and interconnecting all the utilized circuit cells by first and second levels of metallization. This (wiring) determines the locations of all interconnecting metals (wires) in predetermined possible locations (wiring channels). Physical design (determining the specific unit circuit cells to be utilized, their locations, and their interconnecting wires on the masterslice) is either done manually, or automatically by using a computer aided Physical Design System. (Also termed an Engineering Design System, E.D.S.). A number of computer aided physical design systems each employing a stored program computer system, varying in scope of function performed, are known and employed in the art.

According to the invention, steps 18 through 20 are "personalized" steps. In these steps electrical contacts to the devices and various regions of the devices of the selected unit cells of each masterslice are personalized. These electrical contacts are called personalized contacts. By utilizing the personalized contact technique, in accordance with the invention, considerable flexibility is provided to the physical design system such that a very high level of circuit density and wiring density is achieved.

Step 18, FIG. 12D, illustrates all contact openings which are personalized during physical design of a given part number. By using a contact opening mask the desired openings in the silicon nitride layer 521 and silicon oxide layer 520 are provided. These openings are denoted by reference characters 523 and 523A. By using another mask called N+ contact opening mask the thermal oxide layers 517 (step 15) and 520 (step 17) are etched away in the opening 523. Note, however, that the thermal oxide layer 520 is not etched away in the openings 523A which are blocked by the N+ contact opening mask. Both of these masks are personalized during the Physical Design process.

The drawing of step 18, FIG. 12D, does not show in detail the personalized contacts for the Schottky barrier diodes as used in the STL large scale integrated masterslice. However, in FIG. 2D regions marked with reference characters D1, D3, D5 and D6 show the personalized contacts through the first level of insulation 31 for Schottky barrier diodes as personalized for an STL part number. Also in FIG. 11G an all selected contact mask is depicted. This mask is personalized for an STL part number which includes personalized contacts for the Schottky barrier diodes.

Further detailed steps for forming Schottky barrier diodes are described in U.S. Pat. application Ser. No. 827,912 entitled "Tantalum Semiconductor Contacts and Method for Fabricating Same", filed Aug. 26, 1977 by H. M. Dalal et al., and of common assignee herewith.

Step 19, FIG. 12D, shows that N+ dopant (preferably arsenic but not limited thereto) is diffused into the silicon surface through the openings 523 by utilizing a known emitter diffusion process. These N+ diffused regions are denoted by reference characters 524A and 524B. The regions 524A are the emitter regions of the transistors. The regions 524B are utilized hereinafter to form low resistance ohmic contacts to various devices. Namely, ohmic contacts, personalized contacts, to first level metallization will be formed in subsequent steps.

The N+ diffusion mask is also personalized during the physical design process.

Step 20, FIG. 12D, shows the openings 523B which are opened by using a P contact opening mask and known photolithographic and chemical etching processes.

Figure 12E:
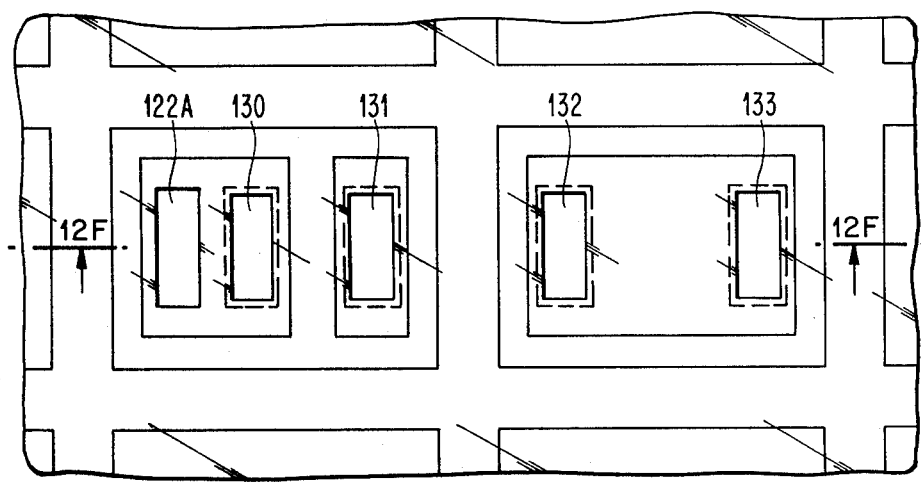
FIG. 12E is a planar view of the completed portion of the large scale integrated device shown in successive fabrication steps in FIGS. 12A-D.
Figure 12F:
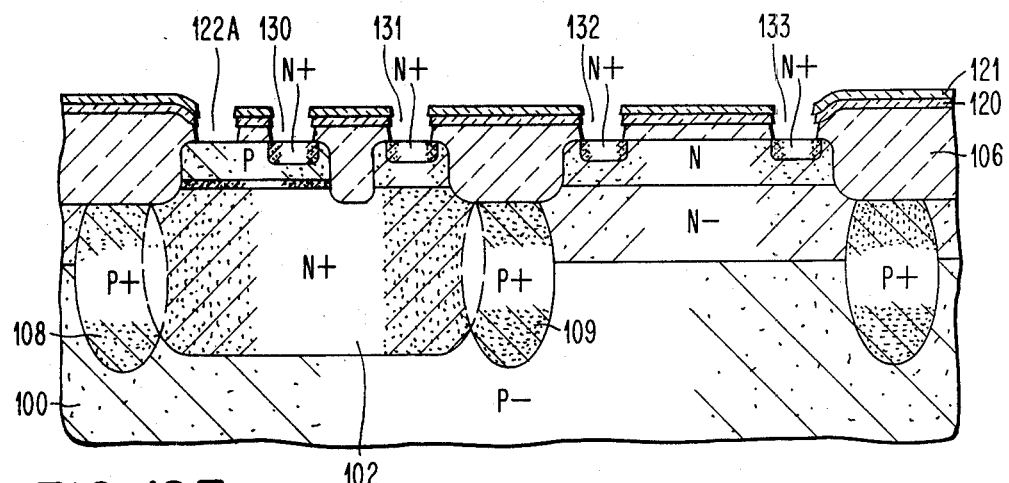
FIG. 12F is a cross-sectional view of the structure of FIG. 12E taken along the line 12F—12F of FIG. 12E.

The drawing of step 20, FIG. 12D, and the drawing of FIG. 12F show the cross section of a small portion of the large scale integrated device (LSI chip) as schematically represented in FIG. 1. FIG. 12E is the top, or plan view of the structural portion shown in FIG. 12F. The cross-sectioned view of FIG. 12F is taken along the line 12F—12F of FIG. 12E. FIGS. 12E and 12F only show a single transistor and a single N type resistor. The structure shown is at the state of completion of step 20 of the manufacturing process. Such a combination of a transistor and a resistor structure is employed in the circuit layouts shown in FIGS. 4, 5 and 6. FIG. 2D shows a cross section of the STL internal circuit transistor and the associated personalized Schottky barrier diodes. The corresponding cross section of the structure of FIG. 12F is also denoted on FIG. 2C by line 12F—12F.

The remaining steps of the manufacturing method will be described with reference to FIG. 9 and 11A through 11F.

In step 21, FIG. 9, the first level metal 122 is formed over the first insulation layers 120 and 121 by known evaporation and chemical etching processes. The first level metal is preferably formed as a combination of aluminum-copper-silicon. The thickness of the first level metal is preferably in the order of 34 microinches (34 millionths of an inch).

First level metal (wires) are personalized during the physical design process. FIG. 11F depicts the mask used to form the specific personalized first level wiring for a particular part number on the large scale integrated device shown in FIG. 1.

In step 22, FIG. 9, a second insulating layer 123 is formed over the first metal 122 and the openings (vias) 124A are formed by known deposition, photolithographic and chemical etching processes. To open the vias 124A a first via mask is used. This mask is also personalized during the physical design process. In FIG. 11E the first via mask for the particular part number is shown.

In step 23, FIG. 9, a second level metal layer 124 is formed over the second insulating layer 123. The second metal layer is personalized by using a second metal mask. FIG. 11D shows a second metal mask for said particular part number. The second level metal mask is personalized during the physical design process. The thickness of the second level metal is preferably in the order of 50 microinches (50 millionths of an inch).

In step 24, FIG. 9, a third insulating layer 125 is formed over the second level metal 124. The second level vias 126A are opened by utilizing known deposition, photolithographic and chemical etching processes. Locations of the second level vias were determined during the design of the large scale integrated masterslice and do not vary from part number to part number. FIG. 11C shows a second via mask used to manufacture said particular part number.

In step 25, FIG. 9, a third level metal layer 126 is formed over the third insulating layer 125 by utilizing a third metal mask and known deposition, photolithographic and chemical etching processes. The thickness of the third level metal is preferably in the order of 90 microinches (90 millionths of an inch). The third level metal is designed during the design of the LSI masterslice and it is fixed. It does not vary from part number to part number.

FIG. 11B shows the third level metal mask used to manufacture LSI part numbers.

In step 26, FIG. 9, a fourth layer of insulation 127 (glass) is formed over the third metal layer 126. The terminal vias 128A are opened by known deposition, photolithographic and chemical etching processes. A terminal via mask is shown in FIG. 11A for the LSI masterslice represented in FIG. 1.

In step 27, FIG. 9, a layer of terminal metal 128 (preferably a combination of Cr, Cu, Au, chromium copper, gold) and the chip joining balls 129 (preferably lead-indium pads) are formed over the fourth level insulating layer 127.

This completes the connection from the silicon surface of the devices on the LSI masterslice to the external devices.

While the invention has been described and shown particularly with reference to one of its preferred embodiments, it will be understood by those skilled in the art to which the work is directed that various changes in form and in detail may be made without departing from either the spirit or scope of the invention.

Having thus described our invention, what we claim as new, and desire to secure by Letters Patent is:

1. In a planar semiconductor integrated circuit chip comprising:
a surface from which a plurality of regions of different conductivity types extend into the chip to provide transistors Schottky barrier diodes and resistors;
said transistors, Schottky barrier diodes and resistors being electrically isolated one from another and arranged in a generally orthogonal array of unit cells wherein each of said unit cells is electrically isolated from each of the remaining cells of said array;
said array of unit cells having 0 through m columns, where m is an integer number;
said array including unit cells of at least first, second, third and fourth types, each said first type unit cell includes a transistor, first and second resistors and at least four Schottky barrier diodes (FIG. 2C), each said second type unit cell includes at least one Schottky barrier diode (FIG. 3), each said third type unit cell includes at least five transistors and at least eight resistors (FIG. 4), and each said fourth type cell includes at least two transistors, at least two Schottky Barrier diodes, and at least three resistors (FIG. 6);
columns 1 through m−1 of said 0 through m columns containing only cells of said first and second types;
column 0 containing at least one cell of said third type and a plurality of cells of said fourth type;
and column m containing exclusively a plurality of cells of said fourth type, whereby said surface of said semiconductor chip is essentially completely utilized to provide unit cells of said first, second, third and fourth types.

2. In a planar semiconductor chip as recited in claim 1, wherein columns 1 through m−1 each include n cells arranged in n rows where n is an integer number.

3. In a planar semiconductor chip as recited in claim 2, wherein at least certain of said n rows of cells of columns 1 through m−1 contain exclusively cells of said second type.

4. In a planar semiconductor chip as recited in claim 3 wherein certain of said n rows of cells of columns 1 through m−1 contain exclusively cells of said second type and the remaining rows of said n rows of cells of columns 1 through m−1 contain exclusively cells of said first type.

5. In a planar semiconductor chip as recited in claim 4 wherein column 0 contains a voltage regulator cell and an even number of driver cells.

6. In a planar semiconductor chip as recited in claim 5 wherein column m contains an even number of driver cells.

7. In a planar semiconductor chip as recited in claim 6 wherein cells of said first type are arranged in a plurality of repetitive clusters of four like cells of said first type and each cell of each cluster of four like cells has a unique geometric orientation with respect to the remaining three like cells contained in its cluster.

8. In a planar semiconductor chip as recited in claim 7 wherein cells of said second type are arranged in a plurality of repetitive clusters of two like cells of said second type and each cell of each cluster of two like cells has a unique geometric orientation with respect to the remaining one cell contained in its cluster.

9. In a planar semiconductor chip as recited in claim 8 wherein said even number of driver cells contained in columns 0 and m are respectively arranged in pairs of two cells, where each pair of driver cells is identical to every other pair of driver cells.

10. In a planar semiconductor chip as recited in claim 9 wherein each of said plurality of repetitive clusters of four like cells of said first type cells is as depicted in FIG. 2 of the drawing.

11. In a planar semiconductor chip as recited in claim 10 wherein each of said plurality of repetitive clusters of two like cells of said second type is as depicted in FIG. 3 of the drawing.

12. In a planar semiconductor chip as recited in claim 11 wherein each cell of each said pair of driver cells is as depicted in FIGS. 5 and 6 of the drawing.

13. In a planar semiconductor chip as recited in claim 12 wherein each voltage regulator cell is as depicted in FIG. 4 of the drawing.

14. In a planar semiconductor chip as recited in claim 13 wherein each cell of the first type may be personalized (wired) in a first or second manner to respectively provide an integrated circuit having the schematic circuit diagram respectively shown in FIGS. 8A and 8C of the drawing.

15. In a planar semiconductor chip as recited in claim 14 wherein any two cells of the first type, contained in the same column, and in the same cluster of four like cells, may be personalized (wired) to provide an integrated circuit having the schematic circuit diagram shown in FIG. 7A of the drawing.

16. In a planar semiconductor chip as recited in claim 15 wherein each pair of driver cells may be personalized (wired) in a first or a second manner, where personalizing said pair of driver cells in said first manner provides an integrated circuit having the schematic circuit diagram shown in FIG. 5A of the drawing and, and where personalizing said pair of driver cells in said second manner provides first and second integrated circuits respectively having the schematic circuit diagram shown in FIG. 6A of the drawing.

Figure 3A:
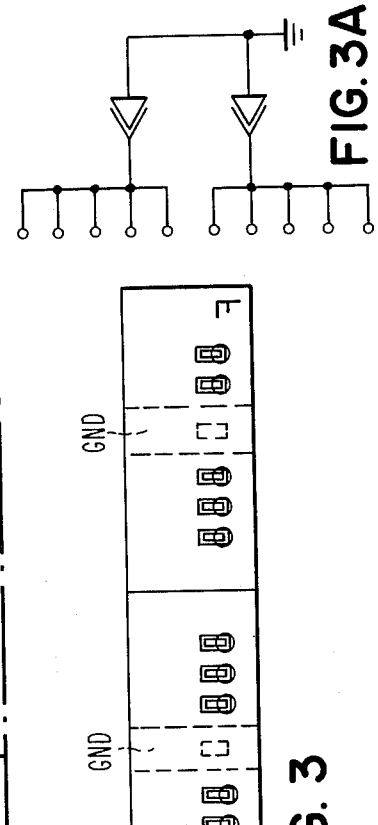
FIG. 3A depicts the schematic circuit diagram corresponding to the two cells of FIG. 3.

17. In a planar semiconductor chip as recited in claim 16 wherein each pair of cells of the second type may be personalized (wired) to provide an integrated circuit having the schematic circuit diagram shown in FIG. 3A of the drawing.

18. In a planar semiconductor chip as recited in claim 17 wherein said voltage regulator cell may be personalized (wired) to provide an integrated circuit having the schematic circuit diagram shown in FIG. 4A of the drawing.

19. In a planar semiconductor chip as recited in claim 18 wherein predetermined ones of said cells of said first, second, third and fourth types are personalized and interconnected with at least first and second levels of metallization to provide a large scale integrated circuit device.

20. In a planar semiconductor chip as recited in claim 19 wherein in addition to said first and second levels of metallization, a third level of metallization connected in a predetermined manner to said second level of metallization is provided, and a fourth level of metallization connected in a predetermined manner to said third level of metallization, said fourth level of metallization comprising an array of conductive pads for providing an electrical interface between said large scale integrated circuit device and circuitry external to said device.

21. In a method of fabricating a large scale integrated circuit device utilizing a semiconductor chip surface having a plurality of unit cells arranged in a predetermined pattern on said semiconductor chip surface, each cell containing components such as transistors, resistors, Schottky barrier diodes, etc., each said cell having predetermined regions for electrically contacting the components of said cell, said method comprising the following steps:

(a) forming a first insulating layer over the surface of said semiconductor chip, said first insulating layer being superimposed over the entire semiconductor surface of each of said cells including said cell contact regions;

(b) determine in accordance with a first part number of a large scale integrated semiconductor device which ones of said plurality of unit cells are to be utilized to provide said large scale integrated semiconductor device, wherein the term part number is defined as a large scale integrated circuit device having a specific circuit configuration and performing a specific function;

(c) opening a predetermined pattern of contact openings in said first insulating layer, said predetermined pattern of contact openings being strictly in accord with the required cell contact regions of the cells to be utilized to provide said large scale semiconductor device in accordance with said first part number;

(d) forming a predetermined pattern of conductors, and conductive contacts in said contact openings, as a first level of metallization over said first insulating layer, where said first level of metallization personalizes each of said contact openings of said predetermined pattern of contact openings and provides intracell and at least partial intercell wiring of the cells selected to be utilized to provide said large scale integrated semiconductor device in accordance with said first part number, whereby only the utilized cells have at least certain of their contacts personalized;

(e) forming a second insulating layer over said first level of metallization and the exposed portions of said first insulating layer;

(f) opening a predetermined pattern of via holes in said second insulating layer, said predetermined pattern of via holes in said second insulating layer being strictly in accordance with the desired interconnection of at least certain of said conductors of said first level of metallization, and conductors of a second level of metallization to be formed hereinafter;

(g) forming a predetermined pattern of conductors, and conductive vias in said via openings of said second insulating layer, as a second level of metallization over said second insulating layer, where said second level of metallization provides intercell wiring and whereby said first level of metallization is interconnected in a predetermined manner with said second level of metallization;

(h) forming a third insulating layer over said second level of metallization and the exposed portions of said second insulating layer;

(i) opening a predetermined pattern of via holes in said third insulating layer, said predetermined pattern of via holes in said third insulating layer being strictly in accordance with the desired interconnection of said conductors of said second level and conductors of a third level of metallization to be formed hereinafter;

(j) forming a predetermined pattern of conductors, and conductive vias in said via openings of said third insulating layer, as a third level of metallization over said third insulating layer whereby said third level of metallization is interconnected in a predetermined manner with said conductors of said second level of metallization;

(k) forming a fourth insulating layer over said third level of metallization and the exposed portions of said third insulating layer;

(l) forming a predetermined pattern of via holes in said fourth insulating layer, where each of said via holes exposes an underlying portion of a third level conductor of said third level of metallization; and (m) forming a conductive pad in each of said via holes in said fourth insulating layer, each said conductive pad electrically contacting the underlying third level conductor and including a portion extending beyond the exposed surface of said fourth insulating layer, whereby a predetermined pattern of contacts is provided as an electrical interface between the large scale integrated semiconductor device in accordance with said first part number and circuitry external to said device.

22. In a method of fabricating a large scale integrated circuit device, as recited in claim 21, wherein said large scale integrated circuit device is fabricated in accordance with a second part number.

23. In a method of fabricating a large scale integrated circuit device utilizing a semiconductor chip surface having a plurality of unit cells arranged in a predetermined pattern on said chip surface as recited in claim 21 wherein in step (d) at least certain ones of said contact openings are personalized to provide Schottky barrier junction contacts with the underlying cell contact regions, and the remaining ones of said contact openings are personalized to provide ohmic contacts with the underlying cell contact regions.

24. A planar semiconductor chip having an exposed surface essentially completely occupied by a sizeable number of wireable unit circuit cells:

each of said unit circuit cells being electrically isolated one from another;

said sizeable number of wireable unit circuit cells comprising Schottky transistor logic (STL) cells (FIG. 2C), Schottky barrier diode (SBD) cells (FIG. 3), driver cells (FIG. 6) and at least one voltage regulator cell (FIG. 4);

said cells being arranged on said chip in thirty-five columns respectively designated as columns C-0, C-1, C2 - - - through C-34;

said columns C-0 through C-34 physically occupying said exposed surface of said semiconductor in the order recited;

column C-0 containing in the order recited a voltage regulator cell and twenty-eight driver cells;

each of the columns C-1 through C-33 containing STL cells and SBD cells; and column C-34 containing thirty driver cells.

25. A planar semiconductor chip having an exposed surface essentially completely occupied by a sizeable number of wireable unit circuit cells, as recited in claim 24, wherein each of said columns C-1 through C-33 are identical one to another in cell content and the cells of each of the columns C-1, C-3, C-5 - - - through C-33 are mirror images of the cells of each of the columns C-2, C-4, C-6 - - - through C-32.

26. In a planar semiconductor chip having an exposed planar surface essentially completely occupied by a sizeable number of wireable cells, as recited in claim 24 wherein each STL cell is contained within a semiconductor surface area having a length L and a width W, where the orientation and perimeter dimensions of each STL cell may be defined by LU (upper length), WR (right-hand width), LL (lower length) and WL (left hand width), where L=LU=LL, W=WR=WL and length L is appreciably greater in magnitude than width W, each said STL cell comprising:

a monolithic portion of P type semiconductor material of said chip having a surface area of L×W;

an elongated N+ subcollector contained beneath the surface of said P type semiconductor material;

said elongated N+ subcollector being essentially coextensive in length with the length L of said cell and being relatively closely spaced from the LL perimeter length of said cell, a first N−region, a P+ region and a second N−region;

said first N−region, said P+ region and said second N− region, in the order recited, extending from said subcollector to said surface area;

a first isolating region positioned between said first N−region and said P+ region;

said first isolating region extending from said surface area to said subcollector;

a second isolating region positioned between said second N−region and said P+ region;

said second isolating region extending from said surface area to said subcollector;

a first N+ pocket in said P+ region;

said first N+ pocket being adjacently spaced from said first isolating region;

a second N+ pocket in said second N−region;

said second N+ pocket being adjacently spaced from said second isolating region;

a first resistor formed by a first isolated elongated region of electrically resistive semiconductor material contained within said cell and a second resistor formed by a second isolated elongated region of electrically resistive semiconductor material contained within said cell;

said first and second regions of electrically resistive semiconductor material extending serially in line essentially the length L of said cell;

said first and second regions of electrically resistive semiconductor material being respectively adjacently spaced from the LU perimeter of said cell.

27. In a planar semiconductor chip having an exposed planar surface essentially completely occupied by a sizeable number of wireable cells as recited in claim 26 wherein said STL cells are arranged in clusters of four STL cells each of said STL cells of each cluster having a unique orientation with respect to the remaining three cells of said same cluster, each said cluster of four STL cells contained within a semiconductor area of 2L×2W where the orientation and perimeter dimensions of each cluster of four STL cells may be defined by LL+LL, WL+WL, LL+LL, WL+WL.

* * * * *